United States Patent
Hayashi et al.

(10) Patent No.: US 7,183,580 B2
(45) Date of Patent: Feb. 27, 2007

(54) ELECTRO-OPTICAL DEVICE, MANUFACTURING METHOD OF THE SAME, AND ELECTRONIC APPARATUS

(75) Inventors: Kenji Hayashi, Suwa (JP); Ryoichi Nozawa, Tatsuno-machi (JP); Katsuji Hiraide, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/927,005

(22) Filed: Aug. 27, 2004

(65) Prior Publication Data

US 2005/0110020 A1   May 26, 2005

(30) Foreign Application Priority Data

| Sep. 24, 2003 | (JP) | .............................. 2003-331687 |
| Oct. 28, 2003 | (JP) | .............................. 2003-367506 |
| Oct. 28, 2003 | (JP) | .............................. 2003-367507 |
| Feb. 3, 2004 | (JP) | .............................. 2004-026723 |
| Jun. 30, 2004 | (JP) | .............................. 2004-193504 |

(51) Int. Cl.
- H01L 29/267 (2006.01)
- H01L 29/04 (2006.01)
- H01L 31/12 (2006.01)
- H01L 33/00 (2006.01)
- H01L 23/48 (2006.01)

(52) U.S. Cl. .......................... 257/81; 257/72; 257/783; 257/787; 257/689; 257/E23.116; 313/493

(58) Field of Classification Search ........ 313/503–504, 313/512, 493; 257/72, 81, 783, 787, 689; 438/48, 128, 149; 345/204
See application file for complete search history.

(56) References Cited

U.S. PATENT DOCUMENTS

| 5,952,778 | A | 9/1999 | Haskal et al. |
| 6,268,695 | B1 | 7/2001 | Affinito |
| 6,429,584 | B2 | 8/2002 | Kubota |
| 6,660,409 | B1 | 12/2003 | Komatsu et al. |
| 2003/0085654 | A1 | 5/2003 | Hayashi |

(Continued)

FOREIGN PATENT DOCUMENTS

JP     B2-2776040     5/1998

(Continued)

*Primary Examiner*—Nitin Parekh
(74) *Attorney, Agent, or Firm*—Oliff & Berridge, PLC

(57) ABSTRACT

To provide an electro-optical device having a buffer layer which planarizes a gas barrier layer so that stress-concentration in the gas barrier layer is reduced, the buffer layer being prevented from leaking out of a predetermined area, and to provide a method of producing the same and an electronic apparatus. In an electro-optical device 1 having, on a substrate 200, a plurality of first electrodes 23, a bank structure 221 having a plurality of openings 221a positioned correspondingly to the formed first electrodes, electro-optical layers 60 arranged in the respective openings 221a, and a second electrode 50 covering the bank structure 221 and the electro-optical layers 60, the device includes a buffer layer 210 formed so as to cover the second electrode 50 and have a substantially flat upper surface, a frame 215 made of a material having no affinity to the buffer layer 210 and surrounding the periphery of the buffer layer 210, and a gas barrier layer 30 covering the buffer layer 210 and the frame 215.

26 Claims, 24 Drawing Sheets

U.S. PATENT DOCUMENTS

2003/0164674 A1  9/2003  Imamura
2004/0066137 A1  4/2004  Hayashi

FOREIGN PATENT DOCUMENTS

| | | |
|---|---|---|
| JP | A-2001-22293 | 1/2001 |
| JP | A-2001-284041 | 10/2001 |
| JP | A-2003-142255 | 5/2003 |
| JP | A-2004-95199 | 3/2004 |
| JP | A-2004-127606 | 4/2004 |
| JP | A-2004-127607 | 4/2004 |
| JP | A-2004-127608 | 4/2004 |

FIG.15

ELECTRO-OPTICAL DEVICE, MANUFACTURING METHOD OF THE SAME, AND ELECTRONIC APPARATUS

BACKGROUND OF THE INVENTION

1. Field of Invention

The present invention relates to an electro-optical device, a manufacturing method of the same, and an electronic apparatus equipped with the electro-optical device.

2. Description of Related Art

It has been one of the subjects in the field of electro-optical devices to enhance the durability of the devices against oxygen, water, and so forth. For example, in organic electroluminescence (hereinafter, abbreviated to organic EL) display devices, which are examples of the electro-optical devices, electro-optical materials (organic EL materials, hole-injection materials, electron-injection materials, or the like) for forming light-emitting layers (electro-optical layers) are deteriorated due to oxygen, water, or the like, and the conductivity of cathodes are reduced due to oxygen, water or the like, and thus, non-light-emitting regions called dark spots are formed. Therefore, problems occur in that the service life of the devices as a light-emitting device is decreased.

To solve the above-described problems, a method has been employed by which a lid made of glass or metal is fixed onto the substrate of a display device so that the substrate is sealed against oxygen, water, or the like. Recently, to cope with the increase in size, the light-weight, and the thickness reduction of display devices, a technique called thin-film sealing has been employed in which a thin film mad of an inorganic compound such as silicon nitrides, silicon oxides, ceramics, or the like, which is transparent and has high gas barrier properties, is formed on light-emitting elements by high-density plasma vapor phase deposition methods (e.g., ion-plating, ECR plasma sputtering, ECR plasma CVD, surface wave plasma CVD, ICP-CVD, or the like) (see Patent Document 1).

Moreover, in the case in which plural second plates are arranged on a first plate in a tile-form to cope with requirements for the realization of large screens, gaps are generated between the second plates, and also water permeates from a resin (adhesive) used for bonding of the second substrates. Thus, an electroconductive material and a light emitting layer tend to be deteriorated. Therefore, a technique has been proposed, by which the side faces of the bonded second plates are surrounded by sealing films (see Patent Document 2).

Patent Document 1] Japanese Unexamined Patent Application Publication No. 2001-284041

Patent Document 2] Japanese Unexamined Patent Application Publication No. 2001-22293

SUMMARY OF THE INVENTION

The thin film (gas barrier layer) made of an inorganic compound and formed by the above-described technique is high-density and very rigid. Thus, if convexities and concavities, and steep steps exist on a surface to be covered with the thin film, external stress concentrates in the formed thin film, so that the thin film will be cracked or peeled off. As a result, the shielding properties are deteriorated. Especially, in the case in which pixel partitions called banks are provided to section a plurality of light-emitting layers, the surfaces of the layers, which are to be covered with the gas barrier layer, becomes concave and convex due to the banks. Thus, external stress concentrates, and the thin film tends to crack or peel off.

Thus, an organic material having a high fluidity is applied before the gas barrier layer is formed, so that a buffer layer, which has a flat surface and is effective in relaxing external stress, is formed. Thereby, the gas barrier layer provided after the formation of the buffer layer can be prevented from cracking and peeling.

However, when the material having a high fluidity is applied on the area where the banks are formed, the material for the buffer layer leaks onto the peripheral area not to be covered. Thus, problematically, the area is undesirably covered with the buffer layer.

Moreover, in the case of the display device in which the plural second plates are arranged in a tile-like pattern on the first plate, it is difficult to assure the gas barrier property. In particular, in the display device, the second plates are arranged on the first plate through an adhesive or the like. Thus, the height becomes irregular, and spaces are formed between the second plates. When the gas barrier layer is provided in the form of a film for the above-described display device, the gas barrier layer becomes concave and convex and has steep steps. The thin film (gas barrier layer) made of an inorganic compound is high-density and very rigid. Thus, if convexities and concavities, and steep steps exist on a surface to be covered with the thin film, external stress concentrates in the formed thin film, so that the thin film will crack or peel off. Problematically, the gas barrier property is deteriorated.

In view of the foregoing, the present invention has been devised. It is an object of the present invention to provide an electro-optical device having a buffer layer which causes the surface of a gas barrier layer to be flat and to relax stress-concentration onto the gas barrier layer, and also, is prevented from leaking onto an undesired area, and to provide a method of producing the electro-optical device and an electronic apparatus.

To solve the above-described problems, the electro-optical device, the method of producing the same, and the electronic apparatus of the present invention employ the following means.

According to a first invention, in an electro-optical device having, on a substrate, a plurality of first electrodes, a bank structure having a plurality of openings positioned correspondingly to the formed first electrodes, electro-optical layers arranged in the respective openings, and a second electrode covering the bank structure and the electro-optical layers, the device includes a buffer layer formed so as to cover the second electrode and have a substantially flat upper surface, a frame made of a material having no affinity to the buffer layer and surrounding the periphery of the buffer layer, and a gas barrier layer covering the buffer layer and the frame.

According to this invention, the buffer layer relaxes stress which is generated due to the distortion and the volume-change occurring on the substrate side. Thus, the second electrode can be prevented from peeling off from the bank structure. Moreover, since the upper surface of the buffer layer is substantially flat, the gas barrier layer made of a rigid coat and formed on the buffer layer becomes flat. Thus, sites into which the stress is concentrated can be eliminated from the gas barrier layer. Thereby, the gas barrier layer can be prevented from cracking.

Furthermore, the frame made of a material having no affinity to the buffer layer is arranged so as to surround the periphery of the buffer layer. Accordingly, when the material for the buffer layer having a high fluidity is arranged (coated), the material can be prevented from flowing out of a predetermine region without swelling of the frame.

In the case of the buffer layer formed with an organic resin material, stress generated due to the distortion and the volume-change on the substrate side can be relaxed in the buffer layer region, owing to the flexibility which is a characteristic of the material.

The buffer layer is a cured coat formed by coating an organic resin material having a lipophilic property and diluted with an organic solvent, and removing the organic solvent component or the remaining water under a reduced pressure. In this case, when the buffer layer material having a high fluidity is arranged (coated), the liquid-repellent layer repels the buffer layer material. Thus, the material is prevented from flowing out of the predetermined area. The second electrode which is in contact with the buffer layer material is prevented from being corroded or the like which will occur due to the moisture absorption.

In the case of the buffer layer containing fine particles, the volume-change of the buffer layer material, which occurs when a film is formed or the temperature changes, can be suppressed. This reduces damages of the gas barrier layer.

In the case of the frame formed with an organic resin material, According to this invention, the frame, together with the buffer layer, relaxes stress which is generated due to the distortion and the volume-change occurring on the substrate side. Thus, the bank structure and the second electrode can be prevented from peeling off from each other.

In the case of the frame which is formed with an organic resin material having a hydrophilic property, when the buffer layer material having a high fluidity is arranged (coated), the frame repels the buffer layer material. Thus, the material is prevented from flowing out of the predetermined area.

In the case of the frame containing fine particles, the volume-change of the frame is suppressed when the frame is formed, or the temperature changes. This reduces damages of the gas barrier layer.

In the case of the frame which is formed with the same material as that for the bank structure, the frame is arranged in the outer periphery of the bank structure so as to surround the buffer layer. Thus, when the buffer layer material having a high fluidity is arranged (coated), the material is prevented from flowing out of the predetermined area of the buffer layer.

Especially, since the frame and the bank structure are formed with the same materials, advantageously, the production process can be carried out simultaneously.

In the case of the walls defining the openings of the bank structure and the surface of the frame which are formed so as to have a liquid-repellent property, the electro-optical layers can be easily arranged in the openings. Moreover, the buffer layer material is prevented from flowing out of the predetermined area.

In the case of the frame which is formed so as to have a contact angle to the substrate of not more than 70°, no steep steps are formed in the gas barrier layer covering the frame. The gas barrier layer can be smoothly formed.

In the case of the frame which is a liquid-repellent film, the liquid repellent layer having a liquid repellent property (water and oil repellent properties) is arranged so as to surround the periphery of the buffer layer. Thus, when the buffer layer material having a high fluidity is arranged (coated), the material is prevented from flowing out of the predetermined area of the buffer layer.

The liquid repellent film is made of a monomolecular film containing fluorine atoms, the buffer layer material having a liquid repellent property (water and oil repellent property) can be easily formed.

The electrode protection layer to prevent the corrosion of the second electrode is provided between the second electrode and the buffer layer. The second electrode can be prevented from corroding during the production process such as the formation of the buffer layer or the like. The electro-conductivity of the second electrode can be satisfactorily maintained.

In the case of the buffer layer which covers the bank structure, ranging over the bank structure, so that the bank structure is not exposed, the concavities and convexities on the surface of the second electrode, which are formed due to the bank structure, can be completely made flat.

In the case of the frame which is formed in the outer periphery of the bank structure, the concavities and convexities on the surface of the second electrode, which are formed due to the bank structure, can be completely made flat. The frame prevent the buffer layer material from flowing out of the predetermined area.

The gas barrier layer covers the buffer layer and the, frame, ranging over the buffer layer and the frame, so that the buffer layer and the frame are not exposed. In this case, substantially the whole surface of the gas barrier layer can be completely made flat.

In the case of the gas barrier layer and/or the electrode protection layer which is formed so as to come into contact with an insulation layer provided in the periphery of the substrate, water or the like can be prevented from permeating through the side-faces.

In the case in which the electrode protection layer and the gas barrier layer are formed so as to come into contact with each other in the outer periphery of the substrate, water or the like can be prevented from intruding into the buffer layer through the side-faces through which water can easily permeate.

In the case in which the gas barrier layer is covered with a protection layer so as not to be exposed, damages or peeling of the gas barrier layer, which will occur due to external impacts or stresses, can be prevented.

According to the present invention, an electro-optical device in which plural second plates having semiconductor elements formed thereon are arranged on a first plate, and electro-optical elements formed on one of the first plate and the second plate are driven by use of the semiconductor elements includes: a frame formed so as to surround the periphery of the plural second plates in the outer periphery of the first plate and have a height larger than that of the second plates; a buffer layer arranged inside of the frame and covering the plural second plates; and a gas barrier layer covering the buffer layer and the frame.

According to the present invention, even if the heights of the second plates are uneven, and gaps occur between the second plates, these steps can be filled by the buffer layer formed within the frame having a larger height than the second plates.

In the case of the buffer layer which is formed so as to have a smooth, continuous upper surface, the gas barrier layer formed on the buffer layer becomes flat. Thus, cracking, which will occur due to stress concentration, can be prevented.

In the case of the electro-optical elements formed on the first plate, a wide light emitting region can be assured. The plate having the semiconductor elements for driving the light emitting region can be produced by use of existing production facilities.

In the case of the electro-optical elements formed on the second plates, the light emitting layers produced with existing production facilities are arranged. Thus, the electro-optical device having a wide light emitting region can be formed.

In the case in which light from the electro-optical elements is transmitted through the first plate and is caused to exit to the outside, a so-called bottom emission type electro-optical device can be formed.

In the case in which light from the electro-optical elements is transmitted through the buffer layer and is caused to exit to the outside, a so-called top emission type electro-optical device can be formed.

According to a second present invention, a manufacturing method of an electro-optical device having, on a substrate, a plurality of first electrodes, a bank structure containing a plurality of openings positioned correspondingly to the formed first electrodes, electro-optical layers arranged in the openings, respectively, and a second electrode covering the bank structure and the electro-optical layers, comprises: a first step of forming a frame in the outer periphery of the bank structure and forming a buffer layer having a substantially flat upper surface in the area surrounded by the frame; and a second step of forming a gas barrier layer so as to cover the frame and the buffer layer.

According to this invention, the buffer layer relaxes stress which is generated due to the distortion and the volume-change occurring on the substrate side. Thus, the second electrode can be prevented from peeling off from the bank structure. Moreover, since the upper surface of the buffer layer is substantially flat, the gas barrier layer made of a rigid coat and formed on the buffer layer becomes flat. Thus, sites into which the stress is concentrated can be eliminated from the gas barrier layer. Thereby, the gas barrier layer can be prevented from cracking.

Furthermore, the frame made of a material having no affinity to the buffer layer is arranged so as to surround the periphery of the buffer layer. Accordingly, when the material for the buffer layer having a high fluidity is arranged (coated), the material can be prevented from flowing out of a predetermine region without swelling of the frame.

In the case in which the first step comprises a step of arranging a material for the frame in the outer periphery of the bank structure; a step of arranging a material for the buffer layer in the area surrounded by the frame; and a step of curing the frame material and the buffer layer material, the frame material and the buffer layer material can be cured in the same process. Thus, the efficiency of the production process can be enhanced.

The method includes a step of adding a curing initiator for curing the buffer layer material to the frame material. In this case, when the buffer layer material is arranged in the area surrounded by the frame, the buffer layer material which is in contact with the frame starts to be cured. Accordingly, the material can be prevented from flowing out of the predetermine area.

In the case in which the frame material of which the viscosity is adjusted to be in the range of 100 to 500000 mPa·s is arranged, the fluidity has a limit, Thus, the frame can be satisfactorily patterned in a predetermined position.

In the case of the frame made of a liquid repellent film, the liquid repellent layer having a liquid repellent property (water and oil repellent properties) is arranged so as to surround the periphery of the buffer layer. Accordingly, when the material for the buffer layer having a high fluidity is arranged (coated), the material can be prevented from flowing out of the predetermine area.

A manufacturing method of an electro-optical device having, on a substrate, a plurality of first electrodes, a bank structure containing a plurality of openings positioned correspondingly to the formed first electrodes, electro-optical layers arranged in the openings, respectively, and a second electrode covering the bank structure and the electro-optical layers, comprises: a step of forming the bank structure, and simultaneously forming a frame in the outer periphery of the bank structure using the same material as that for the bank structure; a step of forming a buffer layer having a substantially flat upper surface in the area surrounded by the frame; and a step of forming a gas barrier layer so as to cover the frame and the buffer layer.

According to this invention, the buffer layer relaxes stress which is generated due to the distortion and the volume-change occurring on the substrate side. Thus, the second electrode can be prevented from peeling off from the bank structure. Moreover, since the upper surface of the buffer layer is substantially flat, the gas barrier layer made of a rigid coat and formed on the buffer layer becomes flat. Thus, sites into which the stress is concentrated can be eliminated from the gas barrier layer. Thereby, the gas barrier layer can be prevented from cracking.

Furthermore, the frame is arranged so as to surround the periphery of the buffer layer. Accordingly, when the material for the buffer layer having a high fluidity is arranged (coated), the material can be prevented from flowing out of the predetermine area. Especially, the frame and the bank structure are formed with the same materials. Thus, the frame and the bank structure can be formed by the same production process.

The method includes a step of processing the walls defining the openings of the bank structure and the surface of the frame at the same time to make them liquid-repellent after the step of forming the bank structure and the frame, In this case, the electro-optical layers can be easily arranged in the openings. Moreover, the buffer layer material can be prevented from flowing out of the predetermine area.

The buffer layer material of which the viscosity is adjusted to be not more than 100 mPa·s is arranged. In this case, the buffer layer having a substantially flat upper surface can be formed due to the high fluidity.

The method includes a step of forming an electrode protection layer of an oxide to prevent the corrosion of the second electrode prior to the formation of the frame. In this case, The second electrode can be prevented from corroding during the production process such as the formation of the buffer layer or the like. The electro-conductivity of the second electrode can be satisfactorily maintained. The electrode protection layer is formed with a material having a liquid-philic property such as an oxide. Thus, a difference is caused between the liquid-philic properties of the electrode protection layer and the frame. Thus, the buffer layer material can be selectively coated in the area where the electrode protection layer surrounded by the frame is formed.

A manufacturing method of an electro-optical device in which plural second plates having semiconductor elements formed thereon are arranged on a first plate, and electro-optical elements formed on one of the first plate and the second plate are driven by use of the semiconductor elements comprises: a step of forming a frame so as to surround the periphery of the plural second plates in the outer periphery of the first plate and have a height larger than that of the second plates; a step of arranging a buffer layer inside of the frame so as to cover the plural second plates; and a step of forming a gas barrier layer so as to cover the buffer layer and the frame.

According to the present invention, even if the heights of the second plates are uneven, and gaps occur between the second plates, these steps can be filled by the buffer layer formed within the frame having a larger height than the second plates. The gas barrier layer is formed on the buffer layer. Thus, the gas barrier layer becomes flat. Cracking, which will occur due to stress concentration, can be prevented.

According to a third invention, an electronic apparatus includes the electro-optical device according to the first invention or the electro-optical device produced by the production method according the second invention. According to the present invention, the gas barrier layer is prevented from peeling off or cracking. Thus, the deterioration of the light emitting layers, which will occur due to water or the like, can be prevented. Thus, an electronic apparatus which is able to display a clear image for a long time-period can be provided.

BRIEF DESCRIPTION OF THE DRAWINGS

FIG. 15 is a cross-sectional view of an EL display device 7;

DETAILED DESCRIPTION OF PREFERRED EMBODIMENTS

Hereinafter, embodiments of the electro-optical device, the method of producing the same, and the electronic apparatus of the present invention will be described with reference to the drawings.

[Electro-Optical Device and Method of Producing the Same]

As the electro-optical device, an EL display device using a field light-emissive substance, especially, an organic electroluminescence (EL) material will be described.

[First Embodiment]

Figure 1:
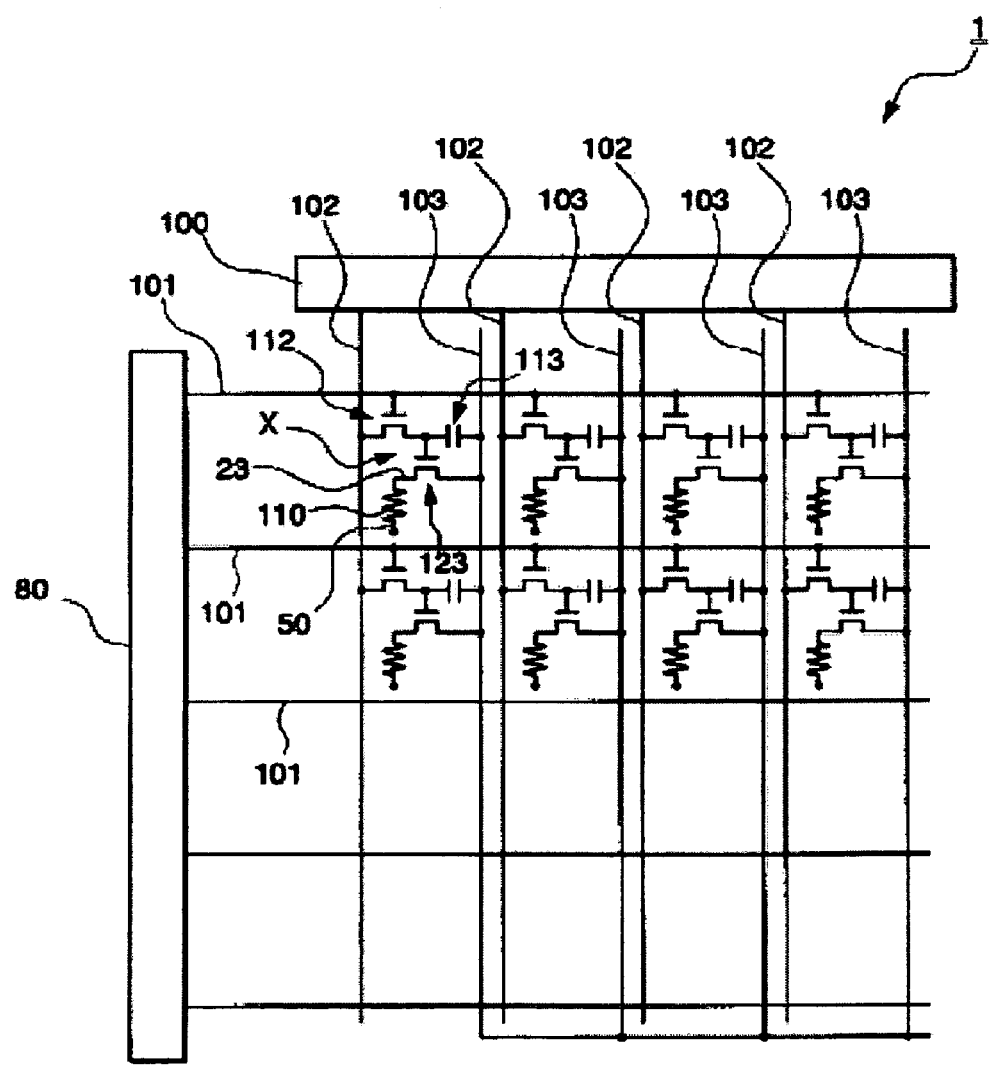
FIG. 1 shows the wiring structure of an EL display device 1.

FIG. 1 shows the wiring configuration of an EL display device 1. The EL display device 1 is an active matrix type EL display device containing thin film transistors (hereinafter, abbreviated to TFT) as switching elements.

Referring to the wiring-configuration of the EL display device (electro-optical device) 1, a plurality of scanning lines 101, a plurality of signal lines 102 extended in such a direction as to intersect the respective scanning lines 101 at a right angle, and a plurality of power-supply lines 103 which are extended in parallel to the signal lines 102 are arranged. Moreover, pixel regions X are provided near the intersecting points of the scanning lines 101 and the signal lines 102, respectively.

A data line drive circuit 100 provided with a shift register, a level shifter, a video line, and an analog switch is connected to the signal lines 102. A scanning line drive circuit 80 having a shift register and a level shifter is connected to the scanning lines 101.

Moreover, each pixel region X is provided with a switching TFT 112 having the gate electrode to which a scanning signal is supplied via the scanning line 101, a retention capacitor 113 retaining a pixel signal supplied via the signal line 102 and the switching TFT 112, a drive TFT 123 having the gate electrode to which the pixel signal retained in the retention capacitor 113 is supplied, a pixel electrode (electrode) 23 into which driving current is caused to flow via the power supply line 103 when the pixel electrode is electrically connected to the power supply line 103 via the drive TFT 123, and an electro-optical layer sandwiched between the pixel electrode (first electrode) 23 and a cathode (second electrode) 50. The pixel electrode 23, the cathode 50, and the electro-optical layer 110 constitute a light-emitting element (organic EL element).

When the scanning line 101 is driven so that the switching TFT 112 is turned on in the EL display device 1, the potential of the signal line 102 is retained in the retention capacitor 113. The on-off of the drive TFT 123 is determined depending on the state of the retention capacitor 113. Thus, electric current is caused to flow into the pixel electrode 23 via the power supply line 103 and the channel of the drive TFT 123. Moreover, electric current flows into the cathode 50 via the electro-optical layer 110. An organic light-emitting layer 60 (see FIG. 3) contained in the electro-optical layer 110 emits light depending on the amount of electric current flowing through the layer 60.

Hereinafter, the configuration of the EL display device 1 is specifically descried with reference to FIGS. 2 to 5.

The EL display device 1 is an active matrix type display device which comprises a plate 20 having an electrically insulating property, the pixel electrode regions (not shown) which are composed of the pixel electrodes connected to the switching TFT (not shown) and arranged in a matrix pattern on the plate 20, the power supply lines (not shown) arranged in the peripheries of the pixel electrode regions and connected to the respective pixel electrodes (not shown), and a pixel portion 3 (the area within the frame shown by the chain line in FIG. 2) positioned at least on the pixel electrode regions and having a rectangular shape as viewed in the plane.

Figure 3:
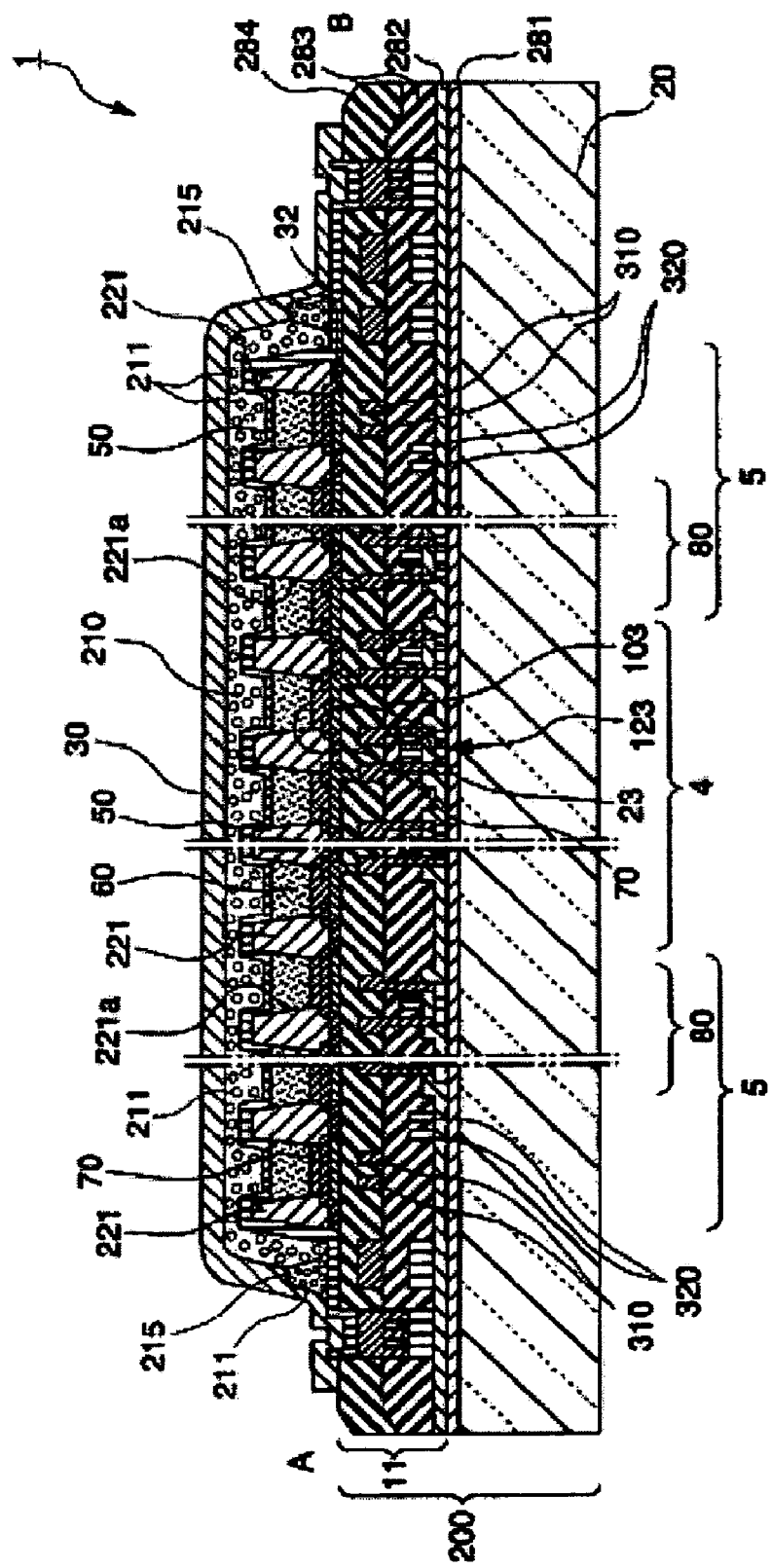
FIG. 3 is a cross-sectional view taken along line A–B in FIG. 2.
Figure 4:
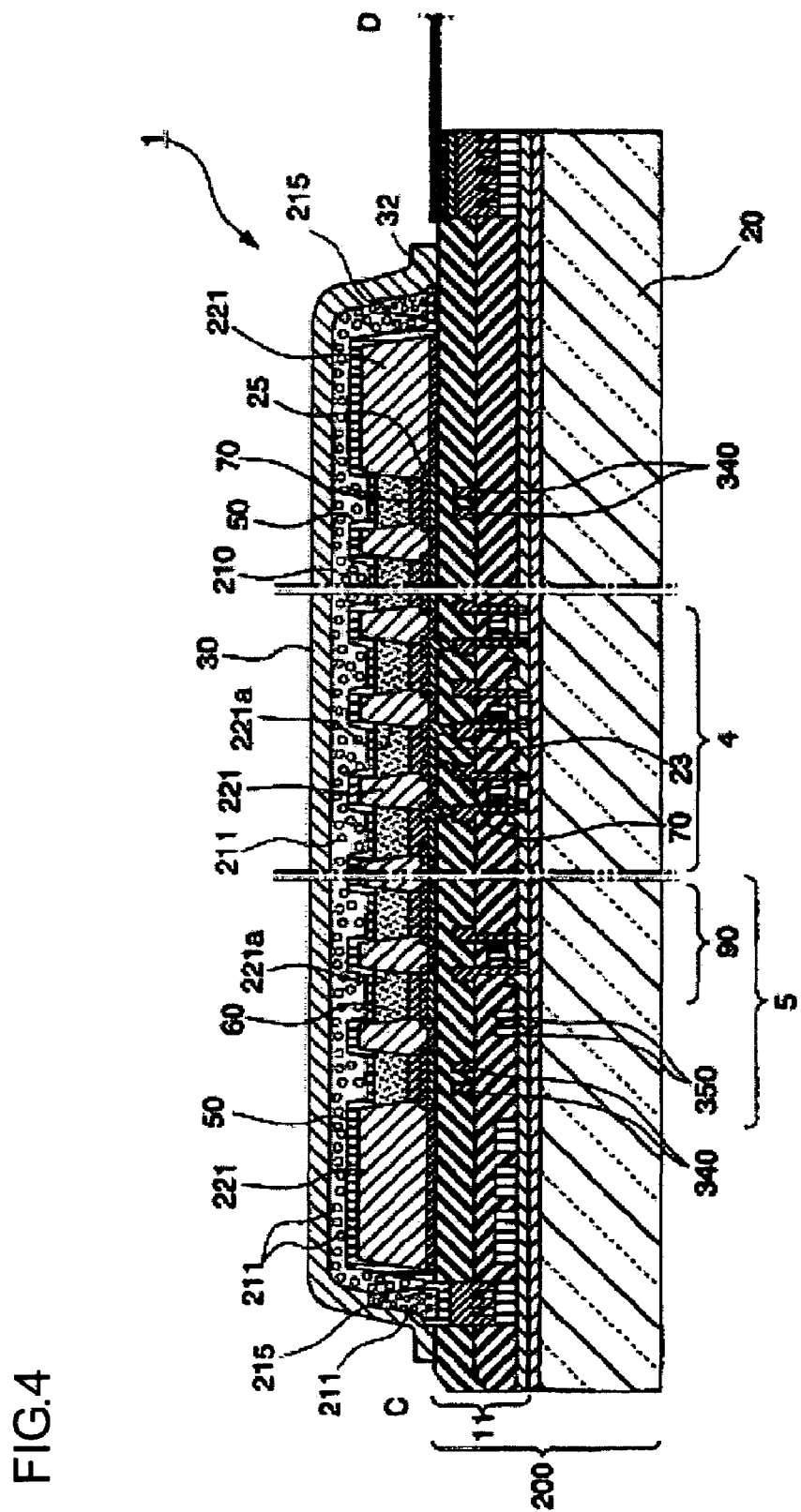
FIG. 4 is a cross-sectional view taken along line C–D in FIG. 2.

In this invention, the whole of the plate 20 and the switching TFTs, various circuits, interlayer insulating films is named a substrate (designated by reference numeral 200 in FIGS. 3 and 4). This will be described below.

Figure 2:
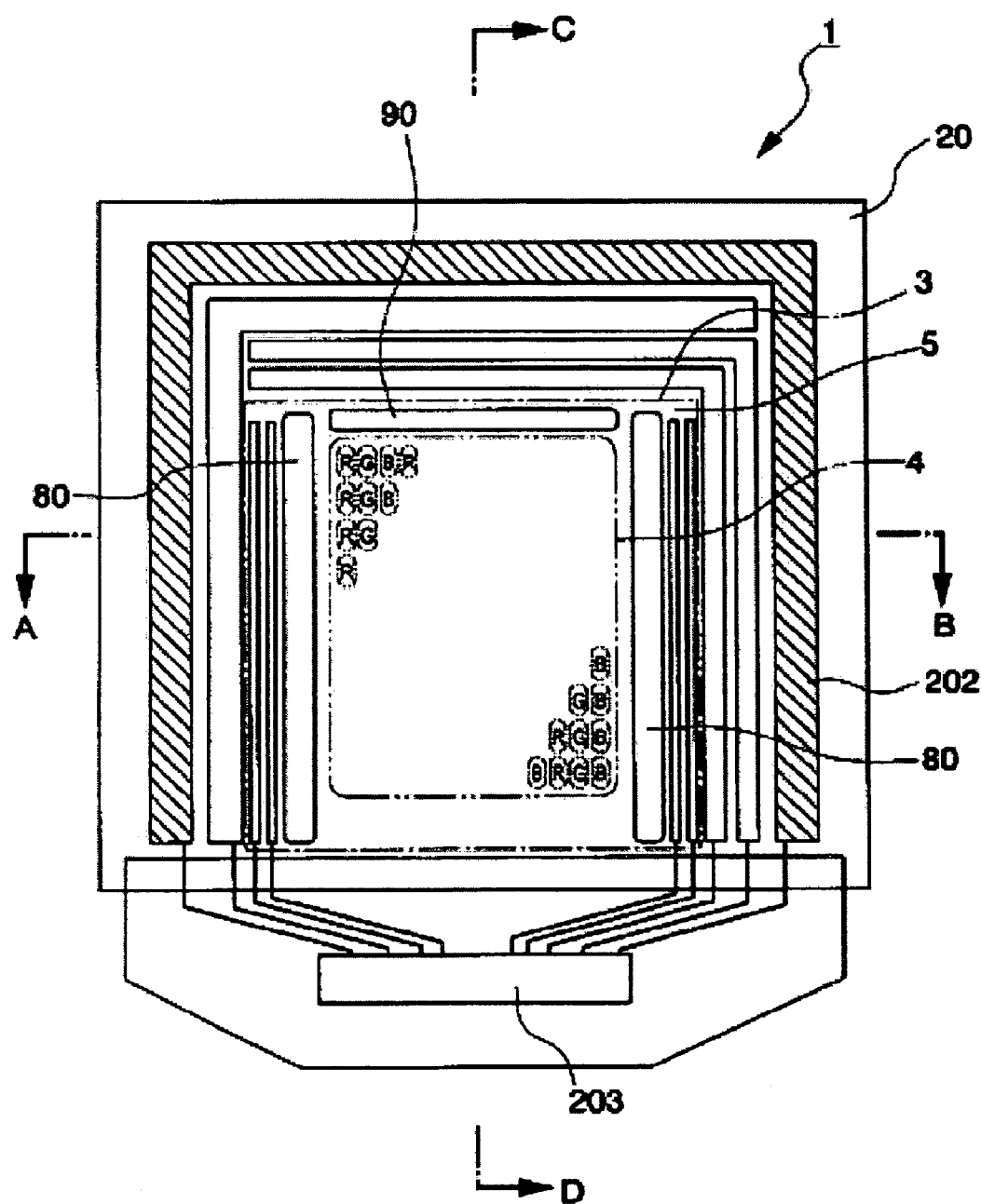
FIG. 2 is a schematic view of the structure of the EL display device 1.

The pixel portion 3 is sectioned into an actual display region 4 (defined to be within the frame shown by the two-dot chain line in FIG. 2) which is positioned in the center thereof, and a dummy region 5 formed in the periphery of the real display region 4 (defined between the one-dot chain line and the two-dot chain line).

In the actual display region 4, regions R, G, and B each containing the pixel electrode are arranged in a matrix pattern in such a manner as to be separated from each other in the direction A–B and in the direction C–D.

Moreover, the scanning line drive circuits 80 and 80 are arranged on both sides of the actual display region 4 as shown in FIG. 2. The scanning line drive circuits 80 and 80 are disposed under the dummy region 5.

Moreover, a check circuit 90 is provided on the upper side as viewed in FIG. 2 of the actual display region 4. The check circuit 90 checks the operation of the EL display device 1. For example, the check circuit 90 has a check-result output means (not shown) for outputting a check result to the outside thereof, so that the qualities and faults of the display device can be checked during the production or at shipment. The check circuit 90 is also arranged under the dummy region 5.

The scanning line drive circuits 80 and the check circuit 90 are configured so that drive voltages can be supplied from predetermined power-supplies to the circuits 80 and 90 via drive voltage conductors 310 (see FIG. 3) and drive voltage conductors 340 (see FIG. 4). A drive control signal and a drive voltage are transmitted and applied to the scanning line drive circuits 80 and the check circuit 90 from a predetermined main driver for operation-controlling the EL display device 1 via a drive control signal conductor 320 (see FIG. 3) and a drive voltage conductor 350 (see FIG. 4). In this case, the drive control signal means an instruction signal. The instruction signal is output from a main driver concerned with controlling which is carried out when signals are output from the scanning line drive circuits 80 and the check circuit 90.

In the EL display device 1, a plurality of light emitting elements (organic EL elements) having the pixel electrodes 23, the organic light emitting layers 60, and the cathodes 50 are formed on the substrate 200, and moreover, a buffer layer 210, a gas barrier layer 30, and so forth are formed so as to cover the light emitting elements.

A frame 215 is formed so as to surround the outer periphery of the buffer layer 210. Thus, when buffer layer 210 is formed, a material for the buffer layer 210 is prevented from flowing out of the frame 215. The gas barrier layer 30 is formed so as to cover the buffer layer 210 and the frame 215.

The organic light emitting layer 60 (electroluminescence layer) is a major layer of the electro-optical layer 110. The electro-optical layer 110 may be provided with a hole injection layer, a hole transport layer, an electron transport layer, a hole blocking layer, and an electron blocking layer, which are sandwiched between the two electrodes.

Referring to the plate 20 constituting the substrate 200, in the case of a so-called top emission type EL display device, emitted light is caused to exit from the gas barrier layer 30 side which positions in opposition to the plate 20. Thus, a transparent plate and also an opaque plate can be employed. As an opaque plate, e.g., ceramics such as alumina or the like, metallic sheets of stainless steel or the like insulation-processed by surface-oxidation or the like, plates made of thermosetting resins or thermoplastic resins, films made of the resins (plastic films), and so forth may be used.

In the case of so-called bottom emission type EL display devices, emitted light is caused to exit from the plate 20 side. Therefore, as the plate 20, transparent and translucent plates are employed. For example, plates made of glass, quartz, resins (plastic sheets, plastic films) or the like may be used. Especially, glass plates are preferably employed. In this embodiment, the display device is a top emission type one in which emitted light is caused to exit from the gas barrier layer 30 side.

Figure 5:
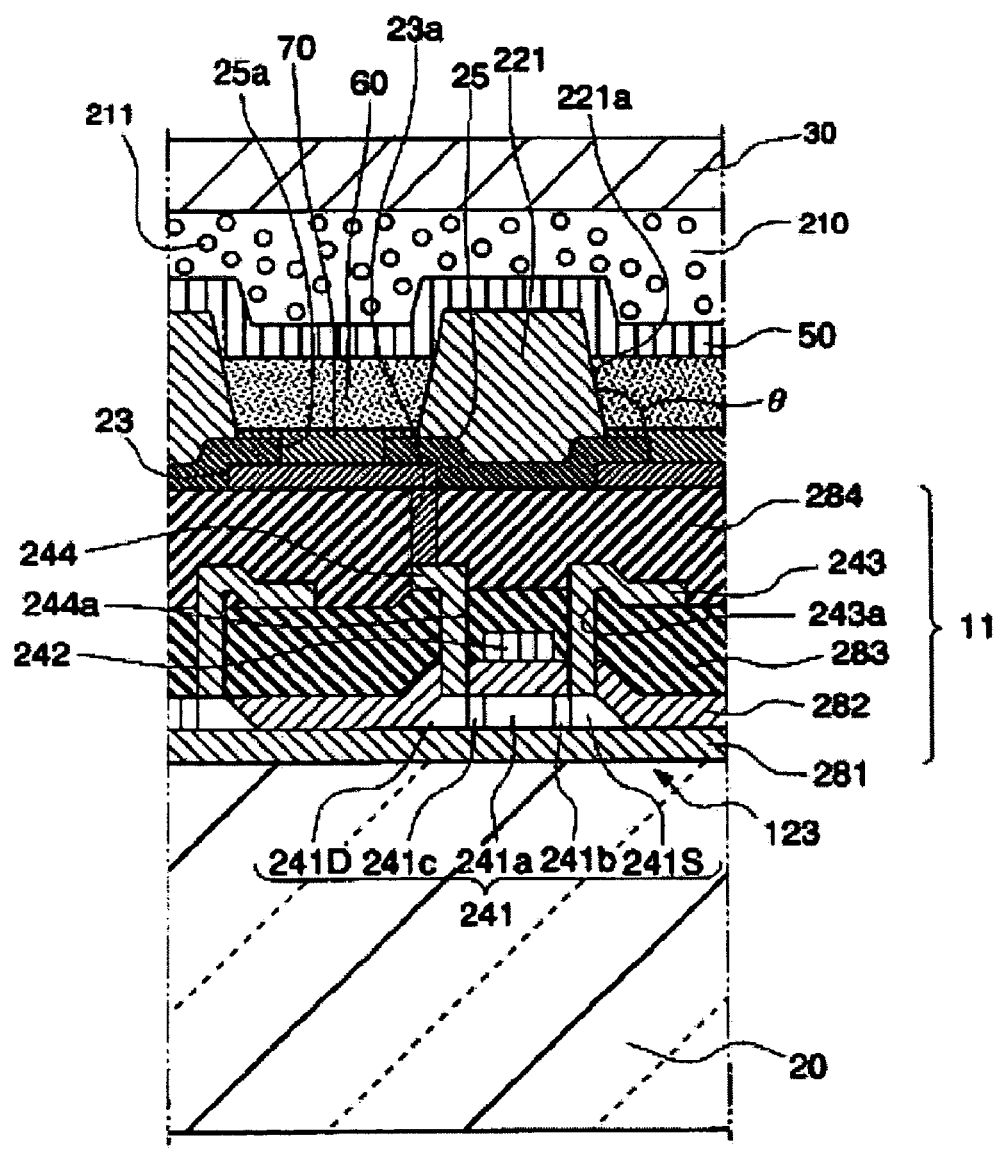
FIG. 5 is an enlarged cross-sectional view of the essential part shown in FIG. 3.

Moreover, a circuit portion 11 containing a drive TFT 123 or the like for driving the pixel electrodes 23 is formed on the plate 20. A plurality of light emitting elements (organic EL elements) are provided thereon. As shown in FIG. 5, the light emitting element comprises the pixel electrode 23 which functions as an anode, a hole transport layer.70 through which a hole is injected/transported from the pixel electrode 23, the organic light emitting layer 60 containing an organic EL substance which is one of electro-optical materials, and the cathode 50, which are formed sequentially in that order.

According to the above-described constitution, a hole injected via the hole transport layer 70 couples with an electron via the cathode 50, so that light is emitted in the light organic emitting layer 60 of the light emitting element.

The display device of this embodiment is a top emission type one. Thus, the pixel electrode 23 need not be transparent. Thus, the pixel electrode is formed with an appropriate electro-conductive material.

As materials for forming the hole transport layer 70, e.g., polythiophene derivatives, polypyrrole derivatives, these materials doped therein, and the like are used. Specifically, a liquid dispersion of 3,4-polyethylenedioxythiophene/polystyrenesulfonic acid (PEDOT/PSS) is used.

As materials for forming the organic light emitting layer 60, known light emissive materials capable of emitting fluorescence or phosphorescence can be employed. Specifically, (poly)fluorene derivatives (PF), (poly)paraphenylenevinylene derivatives (PPV), polyphenylene derivatives (PP), polyparaphenylene derivatives (PPP), polyvinylcarbazole (PVK), polythiophene derivatives, polysilane type materials such as polymethylphenylenesilane (PMPS), and so forth are suitably used.

Moreover, into the above-described polymer materials, polymer materials such as perylene type color matters, cumarine type color matters, Rhodamine type color matters, or the like, and low molecular-weight materials such as rubren, perylene, 9,10-diphenylanthracene, tetraphenylbutadiene, Nile red, cumarine 6, quinacrydone, and the like may be doped and used.

It should be noted that known low molecular weight materials may be used instead of the above-described polymer materials.

Moreover, an electron injection layer made of a metal or metal compound containing as a major component calcium, magnesium, lithium, sodium, strontium, barium, or cesium may be formed on the organic light emitting layer 60, if necessary.

According to this embodiment, the hole transport layers 70 and the organic light emitting layers 60 are surrounded by a liquid-philic property controlling layer 25 and an organic bank layer (bank structure) 221 formed in a grating pattern on the substrate 200, as shown in FIGS. 3 to 5. Thereby, the hole transport layers 70 and the organic light emitting layers 60 surrounded as described above form an element layer which is a single light emitting element (organic EL element).

The angle θ of the respective walls of an opening 221a of the organic bank layer 221 to the surface of the substrate 200 is set to be in the range of 110° to 170° (see FIG. 5). The hole transport layer 70 and the light emitting layer 60, when they are formed by a wet process, can be easily arranged in the opening 221a since the angle θ is set as described above.

The cathode 50, having an area larger than the total area of the actual display region 4 and the dummy region 5, is formed so as to cover the regions 4 and 5 as shown in FIGS. 3 to 5. Thus, the cathode 50 is formed on the substrate 200, covering the upper surfaces of the organic light emitting layers 60 and the organic bank layers 221, and the walls of the outer side-portions of the organic bank layers 221. The cathode 50 is connected to a wiring 202 for the cathode which is formed on the outer side of the organic bank layer 221 and in the outer periphery of the substrate 200 as shown in FIG. 4. A flexible substrate 203 is connected to the wiring 202 for the cathode. Thereby, the cathode 50 is connected to a drive IC (drive circuit)(not shown) on the flexible substrate 203 via the cathode wiring 202.

For the cathode 50, a material having a high electron-injection effect is suitably used. For example, metals of calcium, magnesium, sodium, and lithium, and the metallic compounds of them are used. The metallic compounds include metal fluorides such as calcium fluoride or the like, metal oxides such as lithium oxide or the like, and organic metal complexes such as acetylcetonatocalcium or the like.

These materials have a high electric resistance and can not function as an electrode when singly used. Accordingly, these materials may be used in combination with metal layers of aluminum, gold, silver, copper, or the like, and metal oxide electro-conductor layers of ITO (Indium tin oxide), tin oxide, or the like, i.e., in the form of a laminate. According to this embodiment, a laminate containing lithium fluoride, a metal of magnesium, or ITO has a film-thickness at which the laminate is transparent.

A cathode-protection layer 55 maybe formed on the cathode 50. The thickness of the cathode-protection layer 55 is very thin, and is not shown in the drawings.

The cathode-protection layer 55 is provided to prevent the cathode 50 from being corroded during the production process, e.g., the formation of the buffer layer, and is formed of an inorganic compound, e.g., silicon compounds or metallic compounds. Since the cathode 50 is covered with the cathode-protection layer 55, the corrosion of the cathode 50, which will occur due to the contact of oxygen, water, an organic material, or the like to the cathode 50, can be prevented. The cathode-protection layer 55 having a film-thickness of about 10 nm to 300 nm is formed so as to extend onto an insulation layer 284 in the outer periphery of the substrate 200.

A buffer layer 210 is formed on the cathode 50 so as to range over the organic bank layer 221 and also so as to cover the cathode 50. The buffer layer 210 is formed so as to fill the concavities and convexities of the cathode 50 which is formed in a concave and convex pattern due to the shape of the organic bank layer 221, so that the upper surface of the buffer layer 210 becomes flat.

The buffer layer 210 has a function of relaxing a stress which is generated due to deflection and the expansion of volume occurring on the substrate 200 side. Thus, the buffer layer 210 prevents the cathode 50 from being peeled from the organic bank layer 221 which are not stable. In addition, since the upper surface of the buffer layer 210 is substantially flat, a gas barrier layer 30 made of a rigid film, which is formed on the buffer layer 210, becomes flat. Thereby, sites on which stress concentrates can be eliminated. Thus, the gas barrier layer 30 can be prevented from cracking.

As materials for forming the buffer layer 210, polymer materials (organic resin materials) having a lipophilic property, e.g., polyolefin type resin, polyether type resin, epoxy resin, acrylic resin, silicone resin, polyurethane, polyether, polyester, and so forth are preferable.

Specifically, derivatives produced by mixing acrylic polyols, polyester polyols, polyetherpolyols, or polyurethanepolyols with an isocyanate compound such as tolylenediisocyanate, xylylenediisocyanate or the like, and polymerizing them, or by mixing a bisphenol type oligomer with an amine compound and polymerizing them, and so forth are exemplified.

These organic compounds are diluted with lipophilic organic solvents such as toluene, xylene, cyclohexane, methyl ethyl ketone, ethyl acetate, or the like. Thus, the organic compound is adjusted to have a predetermined viscosity. Thus, the organic compound, i.e., an epoxy oligomer, an acrylic oligomer, olyurethane or the like is applied on the cathode 50.

Isocyanate compounds react with water. Thus, the urea-linkage reaction occurs, resulting in the formation of a polymer. This reaction causes the water remaining in the buffer layer 210 to be fixed. Thus, the water can be prevented from intrude into the cathode 50 and the light emitting layer 60.

Moreover, fine particles 211 are added to (be contained in) the buffer layer 210. Silane compounds such as alkoxysilane, silazane, or the like may be added in stead of the fine particles 211. The fluidity of a material for forming the buffer layer 210 can be adjusted by the addition of the fine particles. Moreover, since the buffer layer 210 contains the fine particles 211, the volume of the buffer layer 210 can be suppressed from changing, which occurs when the film is formed, or the temperature is changed. This reduces the stress, which is to be applied to the gas barrier layer 30.

The fine particles 211 contained in the buffer layer 210 are made of organic polymer materials or inorganic oxide materials. For example, polyester, polystyrene, PMMA (polymethylmethacrylate), silica, and alumina are preferable. The fine particles 211 are surface-treated, e.g., silane-coupling-treated, so that the fine particles 211 become more compatible with the materials for the buffer layer 210.

The fine particles 211 have a particle size of about 10 nm to 1000 nm, and is added to the buffer layer 210 in such an amount as gives a content of 10% to 70%. Thus, the fine particles 211 can enter the stepped portions of the openings 221a or the like of the organic bank layer 221. Thus, a satisfactory layer without gaps can be formed.

Moreover, as a material for forming the buffer layer 210, U curable resins containing, as a major component, methacrylate resins, epoxy resins, or the like can be used. Moreover, the buffer layer 210 can be formed into a film without heat-treatment, since the UV curable resin is used. Thus, a hazardous influence over the organic light emitting layer 60, which will be exerted by heating, can be eliminated. In this case, it is desirable that the cathode-protection layer 55 is made of a UV absorptive material. For example, an oxide semiconductor material having an energy band gap of 3 eV or more and being capable of transmitting visible light such as titanium oxide, zinc oxide, indium tin oxide (ITO) or the like is used for at least a part of the cathode-protection layer 55, so that UV rays transmitted through the buffer layer 210 are absorbed by the cathode-protection layer 55. Thus, the UV rays irradiated to the buffer layer 210 can be prevented from exerting a hazardous influence over the organic light emitting layer 60.

The frame 215 surrounding the buffer layer 210 is formed in the outer periphery of the buffer layer 210.

The frame 215 is provided in the outer periphery of the region where the organic bank layers 221 are formed. When the buffer layer 210 is formed, the frame 215 dams the material for forming the buffer layer which is placed on the cathode 50 to form the buffer layer 210, i.e., prevents the material from flowing out from the predetermined area, that is, from flowing out of the frame 215.

As a material for forming the frame 215, polymer materials (organic resin materials) having a hydrophilic property, e.g., resins having hydroxyl groups, carboxyl groups, or the like such as polyvinylalcohol, polyacrylicacid, polymethacrylatepolyol, polyesterpolyol, or the like, and resins having amino groups and imino groups such as polyethyleneimine or the like are preferable. The above-described polar groups tend to react with isocyanate compounds and epoxy compounds which are a crosslinking component for the material for forming the buffer layer 210. Thus, the material for the buffer layer in contact with the frame 215 reacts and starts to be cured while the material is thickening. Therefore, the material is prevented from flowing out of the frame 215.

Moreover, to enhance the adhesion of the buffer layer to the gas barrier layer 30 and the cathode protection layer 55, a silane compound such as methyl trimethoxysilane, 3-aminopropyl trimethoxysilane, hexamethyl disilazane, or the like may be added as an additive. Moreover, the curing time can be shortened by addition of aminoketone, hydroxyketone, bisacyl phosphine oxide, or the like having a photoreactivity, as an additive.

The material for the frame may be the same as that for the organic bank layer. Thereby, the processes for forming the organic bank layer and the frame can be carried out at the same time.

Moreover, fine particles 211 are added to (be contained in) similarly to the case of the buffer layer 210. A silane compound may be added instead of the fine particles. The fluidity of a material for forming the frame 215 can be adjusted by the addition of the fine particles. Moreover, since the frame 215 contains the fine particles 211, the volume of the buffer layer 210 can be suppressed from changing, which occurs when the film is formed, or the temperature is changed. This reduces the stress which is to be applied to the gas barrier layer 30.

The frame 215 is formed with an organic resin material. Thus, similarly to the buffer layer 210, the frame 215 has a function of relaxing a stress which is generated due to deflection and volume-expansion occurring on the substrate 200 side so that the cathode 50 is prevented from peeling off from the organic bank layer 221.

Moreover, the gas barrier layer 30 is formed on the buffer layer 210 and the frame 215 so as to cover them, preventing them from being exposed. The gas barrier layer 30 is extended onto an insulation layer 284 in the outer periphery of the substrate 200. The gas barrier layer 30 may be formed so as to come into contact with the cathode-protection layer 55 on the insulating layer 284.

The gas barrier layer 30 is provided so that oxygen or water is prevented from intruding into the inner side of the gas barrier layer 30. Thus, oxygen or water is prevented from intruding into the cathode 50 and the organic light emitting layer 60. Thus, deterioration or the like of the cathode 50 and the organic light emitting layer 60, which will be caused by oxygen or water, can be suppressed.

For example, the gas barrier layer 30 is formed with an inorganic compound, preferably with a silicon compound such as silicon nitride, silicon oxide nitride, silicon oxide, or the like by a high density plasma vapor phase deposition method. Moreover, the gas barrier layer 30 may be formed with, e.g., alumina, tantalum oxide, titanium oxide, or other ceramics.

The gas barrier layer 30 may have a two-layer structure made of, e.g., a silicon nitride and a silicon oxide nitride, or a lamination structure formed with ITO and the above-described silicon compound such as a silicon oxide nitride. Thus, the adhesiveness can be enhanced, the stress can be relaxed, and the density of the gas barrier layer made of a silicon compound can be enhanced by the formation of the underlying layer made of an organic compound.

Moreover, preferably, the thickness of the gas barrier layer 30 is in the range of 10 nm to 500 nm. If the thickness is less than 10 nm, perforations may be formed in the part of the gas barrier layer 30 due to film-defects, the dispersion of the film-thickness or the like, so that the gas barrier property is damaged. If the film-thickness exceeds 500 nm, the gas barrier layer 30 may be cracked due to stress.

Moreover, the display device of this embodiment is a top emission type one. Accordingly, it is necessary for the gas barrier layer 30 to be light-transmissible. Thus, according to this embodiment, the light transmittance is set e.g., at 80% or higher in the visible range by appropriate adjustment of the material and the film-thickness of the gas barrier layer 30.

Moreover, a protection layer 204 is formed on the outer side of the gas barrier layer 30 so as to cover the gas barrier layer 30 (see FIG. 8). The protection layer 204 comprises an adhesion layer 205 formed on the gas barrier layer 30 side and a surface protection layer 206.

The adhesion layer 205 is effective in fixing the surface protection layer 206 onto the gas barrier layer 30, and functions so as to buffer mechanical impacts applied from the outside. The adhesion layer 205 is formed with an adhesive of which the material is more flexible and has a lower glass transition point compared with the surface protection layer 206 which is described below. Examples of the material include urethane type resins, acryl type resins, epoxy type resins, polyolefin type resins, or the like. Preferably, a silane coupling agent or an alkoxysilane is added to the above-described adhesive. Thereby, the adhesion of the formed adhesive layer 205 to the gas barrier layer 30 is more enhanced. Accordingly, the buffering function for mechanical impacts becomes greater.

Especially, in the case in which the gas barrier layer 30 is formed with a silicon compound, the silane coupling agent and the alkoxysilane are effective in high adhesion between the adhesive layer 205 and the gas barrier layer 30. Accordingly, the gas barrier property of the gas barrier layer 30 can be enhanced.

The surface protection layer 206 is formed on the adhesion layer 205, and constitutes the surface side of the protection layer 204. The surface protection layer 206 has at least one of the properties of pressure durability, abrasion resistance, an external light reflection preventing property, a gas barrier property, a UV shielding property, and so forth. Specifically, the surface protection layer 206 is formed with a glass plate, or a plastic film of which the outermost surface is formed of a layer of DLC (diamond-like carbon), silicon oxide, titanium oxide, or the like coated thereon.

In the case in which the EL display device of this embodiment is a top emission type one, both of the surface protection layer 206 and the adhesion layer 205 are required to be light-transmissible. However, in the case of a bottom emission type EL display device, the above-described requirement is not made.

A circuit portion 11 is provided below the above-described light emitting element as shown in FIG. 5. The circuit portion 11 is formed on the plate 20, and constitutes the substrate 200. Specifically, an underlying-layer protection layer 281 containing a major component of $SiO_2$ is formed, as an underlying layer, on the surface of the plate 20. A silicon layer 241 is formed thereon. A gate insulating layer 282 containing $SiO_2$ and/or SiN as a major component is formed on the surface of the silicon layer 241.

A region which is a part of the silicon layer 241 and overlap a gate electrode 242 with the gate insulating layer 282 being interposed between them is a channel region 241a. The gate electrode 242 is a part of a scanning line 101 (not shown). A first interlayer insulation layer 283 containing $SiO_2$ is formed on the surface of the gate insulation layer 282 which covers the silicon layer 241 and has the gate electrode 242 formed thereon.

Moreover, in the silicon layer 241, a low concentration source region 241b and a high concentration source region 241S are provided on the source side of the channel region 241a. On the other hand, a low concentration drain region 241c and a high concentration drain region 241D are provided on the drain side of the channel region 241a. Thereby, a so-called LDD (Light Doped Drain) structure is formed. Of these regions, the high concentration source region 241S is connected to a source electrode 243 via a contact hole 243a which passes through the gate insulation layer 282 and a first interlayer insulation layer 283. The source electrode 243 is formed as a part of the above-described power supply line 103 (see FIG. 1, and in FIG. 5, the power supply line is extended perpendicular to the drawing-paper plane at the position of the source electrode 243). On the other hand, the high concentration drain region 241D is connected to a drain electrode 244 composed of the same layer as the source electrode 243 via a contact hole 244a which passes through the gate insulation layer 282 and the first interlayer insulation layer 283.

The upper layer of the first interlayer insulation layer 283 having the source electrode 243 and the drain electrode 244 formed thereon is covered with a second interlayer insulation layer 284 containing as a major component a silicon compound having a gas barrier property such as silicon nitride, silicon oxide, silicon oxide nitride, or the like. The second interlayer insulation layer 284 may be a single layer made of a silicon compound such as silicon nitride (SiN), silicon oxide ($SiO_2$) or the like, or may be used in combination with a wiring planarized layer made of an acrylic resin or the like. A pixel electrode made of ITO is formed on the surface of the second insulating layer 284, and is connected to the drain electrode 244 via a contact hole 23a formed in the second interlayer insulation layer 284. That is, the pixel electrode 23 is connected to the high concentration drain region 241D of the silicon layer 241 via the drain electrode 244.

TFTs (drive circuit TFTs) contained in the scanning line drive circuits 80 and the check circuit 80, i.e., N-channel or P-channel TFTs constituting the shift registers contained in these drive circuits have the same structure as the drive TFT 123 except that the N-channel or P-channel TFTs are not connected to the pixel electrode 23.

The pixel electrode 23, the above-described liquid-philic property control layer 25 and organic bank layer 221 are provided on the surface of the second interlayer insulation layer 284. The liquid-philic property control layer 25 contains a liquid-philic material such as $SiO_2$ or the like as a major component. The organic bank layer 221 is made of an acrylic resin, polyimide or the like. The hole transport layer 70 and the organic light emitting layer 60 are laminated in that order in an opening 25a of the liquid-philic property control layer 25 and in an opening 221a surrounded by the organic bank layers 22 1, which are provided on the pixel electrode 23. It is to be noted that in this embodiment, "liquid-philic property" of the liquid-philic property control layer 25 is higher than that of the material constituting the organic bank layer 221 such as acrylic resin, polyimide, or the like.

The layers ranging from the surface of the plate 20 to the second interlayer insulation layer 284 as described above constitute the circuit portion 11.

In this case, the respective organic light emitting layers 60 of the EL display device 1 of this embodiment are formed in such a manner that their light emission wavelength bands correspond to the primaries. For examples, as the organic light emitting layers 60, organic red-color light emitting layers 60R of which the light emission wavelength band corresponds to red color, green color organic light emitting layers 60G of which the light emission wavelength band corresponds to green color and organic blue-color light emitting layers 60B of which the light emission wavelength band corresponds to green color are formed in display regions R, G, and B, respectively. These display regions R, G, and B constitute one pixel which carries out color-display. BM (black matrix) (not shown) is formed in a film-shape in the boundaries between the color display regions, e.g., between the organic bank layer 221 and the liquid-philic property control layer 25, e.g., by sputtering metal chromium.

Hereinafter, an example of a method of producing the EL display device 1 according to this embodiment will be decried with reference to FIGS. 6 to 8. The cross-sectional views of FIGS. 6 to 8 correspond to the cross-sectional view taken along line A–B in FIG. 2.

According to this embodiment, the EL display device 1 as an electro-optical device is a top emission type one. The process of forming the circuit portion 11 on the surface of the plate 20 is the same as that according to a know technique. Thus, the description is not repeated.

Figure 6A:
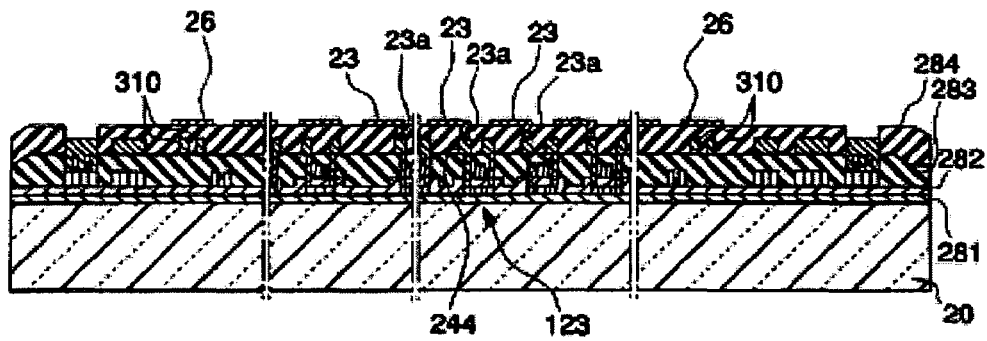
FIG. 6 sequentially illustrates the steps of a method of producing the EL display device 1.

First, as shown in FIG. 6(a), an electro-conductive film to form the pixel electrodes 23 are formed so as to cover the whole surface of the plate 20 having the circuit portion 11 formed thereon. Moreover, the transparent electro-conductive film is patterned, so that the pixel electrodes 23 connected to the drain electrodes 244 via the contact holes 23a of the second interlayer insulation layer 284 are formed. Simultaneously, a dummy pattern 26 is formed in a dummy region.

In FIGS. 3 and 4, the pixel electrodes 23 and the dummy pattern 26 are wholly named pixel electrodes 23. The dummy pattern 26 is formed so as not to be connected to the metal wiring of the lower layer via the second interlayer insulation layer 284. That is, the dummy pattern 26 has an islands-like pattern. The island-like portions have the same shape as that of the pixel electrodes 23 formed in the real display region. Needless to say, the dummy pattern 26 may have a structure of which the shape is different from the pixel electrodes 23 formed in the actual display region. In this case, the dummy pattern 26 contains at least the island-shaped portions which are positioned above a drive voltage conduction portion 310 (340).

Figure 6B:
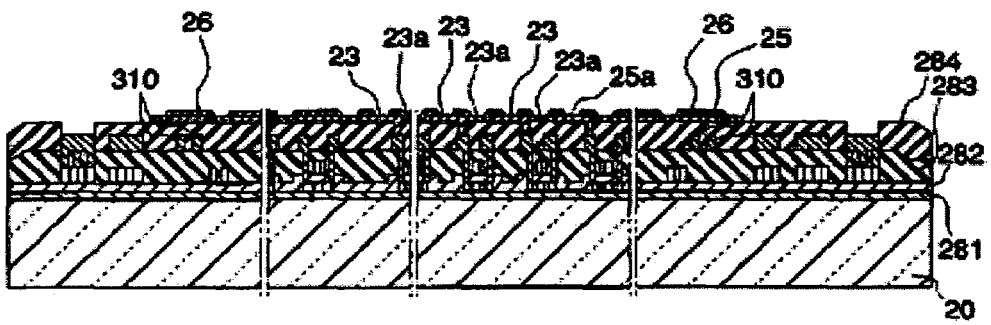
Figure 6C:
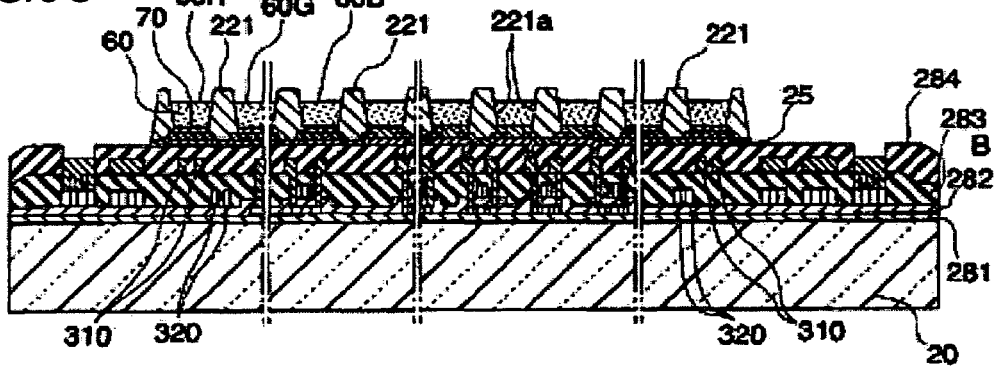

Subsequently, as shown in FIG. 6(*b*), the liquid-philic property control layer 25, which is an insulation layer, is formed on the pixel electrodes 23, the dummy pattern 26, and the second interlayer insulation film. The liquid-philic property control layer 25 is formed in such a manner that a part of the liquid-philic property control layer 25 is opened on the pixel electrodes 23. Thus, holes can be moved from the pixel electrodes 23 in the openings 25*a* (also, see FIG. 3). On the other hand, in the dummy pattern 26 not provided with the openings 25*a*, the insulation layer (liquid-philic property control layer) functions as a hole-movement blocking layer. Thus, no hole-movement occurs therein. Subsequently, in the liquid-philic property control layer 25, MM (black matrix) (not shown) is formed in concavities positioned between different two pixel electrodes 23. Specifically, films are formed in the concavities of the liquid-philic property control layer 25 by a sputtering method using metal chromium.

Thereafter, as shown in FIG. 6(*c*), the organic bank layers 221 are formed in the predetermined positions of the liquid-philic property control layer 25, i.e., so as to cover the above-described MM. Specifically, referring to the formation of the organic bank layers, e.g., acrylic resins, polyimide resins, or the like are dissolved in a solvent and applied by one of different coating methods such as spin coating, dip coating, and the like. Thus, an organic layer is formed. As a material for forming the organic layer, any type of materials may be employed, provided that the materials are insoluble in the solvents of ink described below, and can be easily patterned by etching or the like.

Moreover, the organic layer is patterned by a photolithographic technique and an etching technique, so that the openings 221*a* are formed in the organic layer. Thus, the organic bank layers 221 having walls in the openings 221*a* are formed. In this case, the walls defining the openings 221*a* are formed in such a manner that the angle θ of each wall to the surface of the substrate 200 is in the range of 110° to 170°.

In this case, it is defined that the organic bank layer 221 should include at least the pieces positioned above the drive control signal conduction portions 320.

Subsequently, a region exhibiting a liquid-philic property and a region exhibiting a liquid-repellent property are formed on the surface of each organic bank layer 221.

According to this embodiment, the respective regions are formed by plasma-processing. Specifically, the plasma-processing is carried out by a preheating step. A step of giving the ink-philic property to the upper surfaces of the organic bank layer 221, the walls of the openings 221*a*, the electrode surfaces 23*c* of the pixel electrodes 23, and the upper surfaces of the liquid-philic property control layers 25, respectively, a step of giving an ink-repellent property to the upper surface of the organic bank layers 221 and the walls of the openings 221*a*, and a cooling step.

In particular, a base material (plate 20 including the banks or the like) is heated at a predetermined temperature of, e.g., about 70 to 80° C., and as the step of giving the ink-philic property, plasma-processing is carried out ($O_2$ plasma-processing) in an atmospheric environment using oxygen as a reaction gas. Subsequently, as the step of giving the ink-repellent property, plasma-processing is carried out in an atmospheric environment using tetrafluoromethane as a reaction gas ($CF_4$ plasma processing). Thereafter, the base material heated for the plasma-processing is cooled to a room temperature. Thus, the liquid-philic property and the liquid repellent property are rendered to the predetermined portions.

The electrode surfaces 23*c* of the pixel electrodes 23 and the liquid-philic property control layer 25 are affected to some degree by the $CF_4$ plasma-processing. However, ITO which is the material constituting the pixel electrodes 23, and $SiO_2$, $TiO_2$, or the like which is a material constituting the liquid-philic property control layers 25 have a low affinity to fluorine. Thus, the hydroxyl groups formed by the step of giving the ink-philic property are not substituted by fluoro-groups. Thus, the liquid-philic property can be maintained.

Then, in the step of forming a hole transport layer, the hole transport layers 70 are formed. In the step of forming a hole transport layer, a hole transport layer material is coated on the electrode surfaces 23*c* by a liquid-drop jetting method such as ink jet method or the like, a slit coat method, or the like followed by drying processing and heat treatment. Thus, the hole transport layers 70 are formed on the electrodes 23. In the case in which the hole transport layer material is selectively coated e.g., by an ink jet method, first, a hole transport layer material is charged in an ink jet head (not shown). The jetting nozzle of the ink jet head is placed so as to be opposed to the electrode surfaces 23*c* positioned in the openings 25 which is formed in the liquid-philic property control layers 25. While the ink jet head and the base material (plate 20) are relatively moved, liquid drops of which the amount per one drop is controlled are jetted through the jetting nozzle onto the electrode surfaces 23*c*. After jetting, the liquid drops are dried, so that the disperse medium or solvent contained in the hole transport layer material is evaporated off. Thus, the hole transport layers 70 are formed.

In this case, the liquid drops jetted through the jetting nozzle extends on the electrode surfaces 23*c* which is processed so as to have the liquid-philic property, and is filled into the openings 25*a* of the liquid-philic property control layers 25. On the other hand, the liquid drops repels from the upper surfaces of the organic bank layers 221 processed so as to have the ink-repellent property. Thus, the liquid drops are prevented from adhering to the upper surfaces. Accordingly, even if the liquid drops are departed from the predetermined jetting-positions and jetted onto the organic bank layers 221, the upper surfaces does not be wetted with the drops, and the repelled drops are rolled into the openings 25*a* of the liquid-philic property control layers 25.

Preferably, the process succeeding the step of forming the hole transport layers is carried out in an inert gas atmosphere such as a nitrogen atmosphere, an argon atmosphere, or the like, so that the oxidation of the hole transport layer 70 and the organic light emitting layer 60 can be prevented.

Then, the organic light emitting layers 60 are formed in the step of forming a light emitting layer. In this step, a material for forming a light emitting layer is jetted onto the hole transport layers 70, e.g., by an ink jet method, followed by drying and heat treatment. Thus, the organic light emitting layers 60 are formed in the openings 221*a* defined by the organic bank layers 221. In the step of forming a light emitting layer, to prevent the hole transport layers 70 from being dissolved again, a non-polar solvent incapable of dissolving the hole transport layers 70 is used as a solvent for use with a material for forming the light emitting layers.

In the step of forming the light emitting layers, a material for forming a blue color (B) light emitting layer is selectively coated on a blue color display region, and is dried. Thereafter, similarly, for green color (G) and a red color (R), materials are selectively coated in display regions, respectively, and are dried.

An electron injection layer made a metal or metal compound containing as a major component calcium, magnesium, lithium, sodium, strontium, barium, and/or cesium may be formed, if necessary.

Figure 7D:
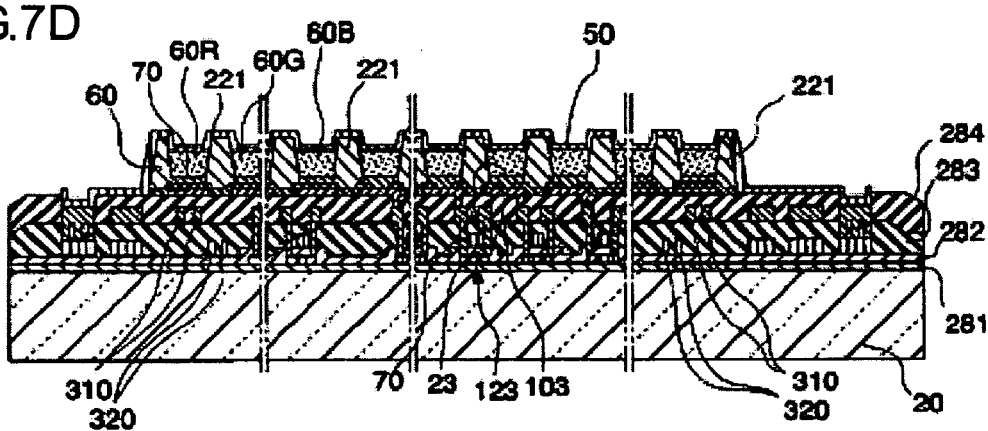
FIG. 7 illustrates the steps succeeding those of FIG. 6.

Subsequently, as shown in FIG. 7(d), a cathode 50 is formed in the step of forming a cathode layer. In the step of forming a cathode layer, e.g., ITO is formed into a film by a vapor phase deposition method such as a high density plasma vapor phase deposition method, or the like. Thus, the cathode 50 is formed. In this case, the cathode 5 is formed so as to cover the upper surfaces of the organic light-emitting layers 60 and the organic bank layers 221 and also the walls of the outer side-portions of the organic bank layers 221.

In the case in which the cathode protection layer 55 is formed on the cathode 50, titanium oxide, silicone oxide nitride or the like is formed into a film on the cathode 50 by a vapor phase deposition method such as a high density plasma vapor phase deposition method or the like.

Figure 7E:
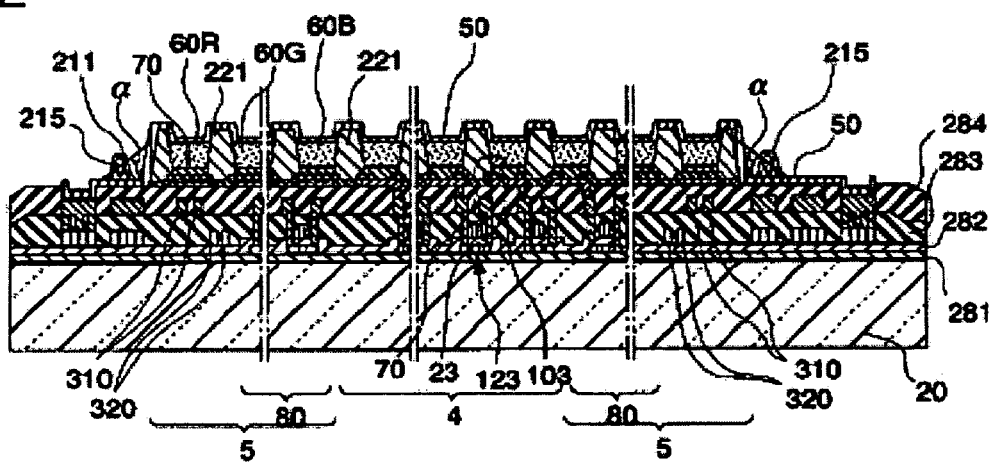

Subsequently, as shown in FIG. 7(e), the frame 215 is formed by a coating method, i.e., a wet process.

Prior to the formation of the frame 215, a curing reaction initiator for curing the buffer layer material is added to the frame material. The viscosity of the frame material is adjusted to be in the range of 100 to 500000 mPa·s, preferably about 1000 to 50000 mPa·s.

The viscosity of the frame material may be adjusted by addition of the fine particles 211. When the viscosity of the frame material is adjusted to a relatively high value as described above, the frame 215 can be satisfactorily arranged (patterned) in a predetermined position by means of a dispenser or by screen printing.

The frame 215 is continuously coated in a ring-pattern so as to surround the area where the organic bank layers 221. Moreover, the frame 215 is formed in such a manner that the cross-sectional shape has a contact angle α to the substrate 200 is not more than 70°.

When the contact angle α to the substrate 200 is small, the gas barrier layer 30 can be smoothly formed without generation of steep steps and so forth. Thus, the gas barrier layer 30 can be prevented from cracking or the like.

A pre-baking process (preparatory curing) may be provided to further increase the viscosity of the frame material after it is applied.

Figure 7F:
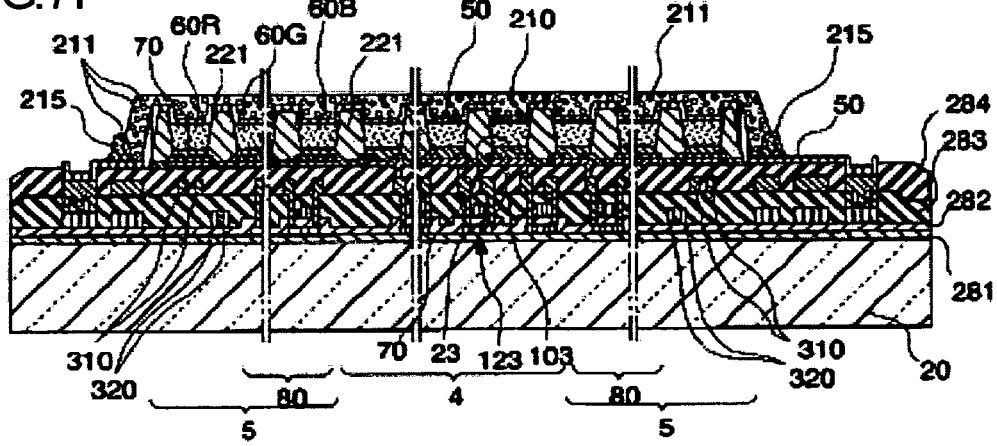

Then, as shown in FIG. 7(f), the buffer layer 210 is formed by a coating method (wet process).

The viscosity of the material for forming the buffer layer, which is to be coated onto the cathode 50, is adjusted to not more than 100 mPa·s, preferably, to about 1 to 30 mPa·s, using an organic solvent. When the viscosity of the buffer layer material is adjusted to be low, the buffer layer material sufficiently enters concavities on the surface of the cathode 50. Moreover, the buffer layer material, of which the flow property is high, can be easily formed in such a manner that the upper surface thereof is smooth and continuous. The fin particles 211 is added to the buffer layer material in advance in such an amount as gives a predetermined content.

The buffer layer material is coated on the area surrounded by the frame material by a slit coating (or curtain coating) method or a screen-printing method. Further, the buffer layer material may be coated with an ink jet device. In the case in which the buffer layer is formed by an ink jet method, first, a material for the buffer layer is charged into an ink jet head (not shown). The jet nozzle of the ink jet head is positioned in opposition to the cathode 50. Liquid drops of which the liquid amount per one drop is controlled are jetted to the cathode 50 through the jet nozzle while the ink jet head and the base material (plate 20) are relatively moved.

When the buffer layer material is coated in the area surrounded by the frame material, the buffer layer material is suppressed from flowing out of the area defined by the fame material. The buffer layer material of which the fluidity is high tends to be spread out of the coated area. Especially, the area on which the buffer layer material is coated is concave and convex, due to the organic bank layers 221. Thus, the buffer layer material easily flows out through the side-wall portions of the organic bank layers 221. However, the frame material having a hydrophilic property which is not compatible with (not having affinity with) the lipophilic buffer layer material is disposed on the outside of the organic bank layers 221. Therefore, the buffer layer material can not flow over the frame material, and is retained in the area defined by the frame material. Moreover, the buffer layer material in contact with the frame material reacts with the frame material, and starts to be cured while the buffer layer material is thickening. Thus, it is more difficult for the buffer layer material to flow over the frame material, so that the buffer layer material is retained in the area defined by the frame material.

Subsequently, a drying (curing) process is carried out, in which the buffer layer material and the frame material coated on the cathode 50 are simultaneously dried (cured). Referring to the drying curing conditions, the solvent components, the remaining water, or the like are removed under a very low pressure, are heated at a temperature less than 120° C. or are irradiated with light. Thereby, the organic solvents added to the buffer layer material and the frame material for adjustment of the viscosities are evaporated. Thus, the buffer layer 210 and the frame 215 are formed.

As described above, the heating at a temperature less than 120° C. or the light irradiation is carried out so that the buffer layer material and the frame material are cured. Thus, the organic light emitting layer 60 is prevented from being heated at a temperature higher than the upper limit for the heat resistance. Thus, the satisfactory organic light emitting layers 60 can be obtained.

In addition, the buffer layer material and the frame material are simultaneously heated. Accordingly, the production processes and facilities can be simplified, and the efficiencies thereof can be enhanced. Thus, the cost for products can be reduced.

Figure 8G:
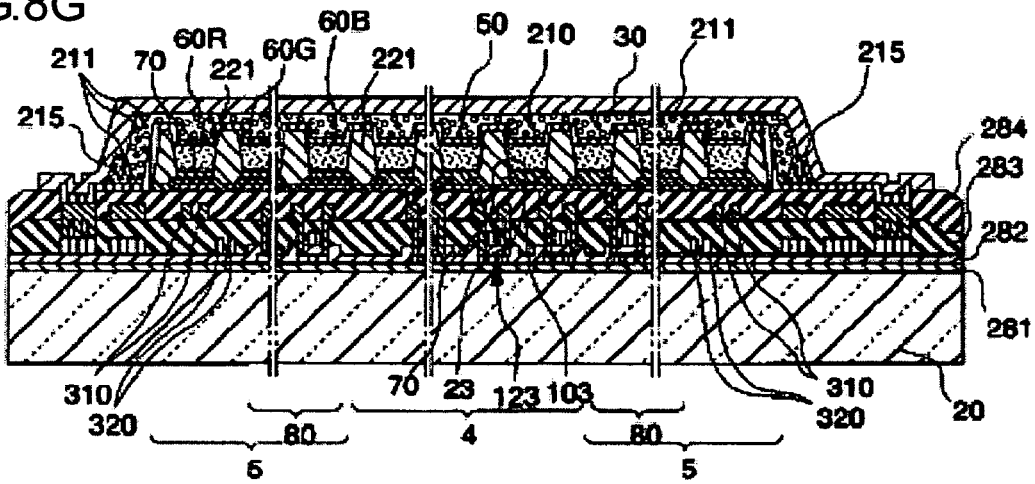
FIG. 8 illustrates the steps succeeding those of FIG. 7.

Thereafter, as shown in FIG. 8(g), the gas barrier layer is formed so as to cover the cathode 50, the buffer layer 210, and the frame 215, i.e., so as to cover all of the exposed portions of the cathode 50 on the substrate 200.

Referring to the formation of the gas barrier layer 30, a silicon compound such as silicon oxide nitride or the like is formed by a high density plasma vapor phase deposition method.

Moreover, regarding the formation of the gas barrier layer 30, the gas barrier layer 30 may be formed as a single layer using a silicon compound as described above. Moreover, the gas barrier layer 30 may be formed so as to be made up of at least two, i.e., plural layers laminated together using a combination of a silicon compound and a material different from the silicon compound. Furthermore, the gas barrier layer 30 may be formed as a single layer in which the composition is changed continuously or discontinuously in the thickness direction.

Figure 8H:
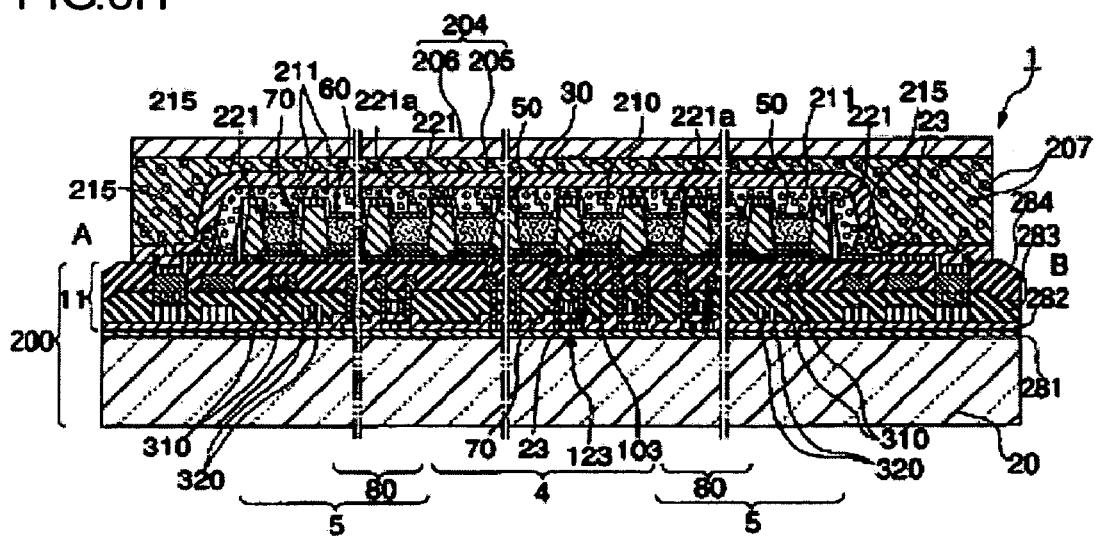

As shown in FIG. 8(h), the protection layer 204 comprising the adhesion layer 205 and the surface protection layer 206 are formed on the gas barrier layer 30. The adhesion layer 205 is formed by uniformly coating on the gas barrier layer 30 by a screen printing method, a slit coating method or the like. Then, the surface protection layer 206 is bonded thereon.

The protection layer 204, provided on the gas barrier layer 30, has pressure-durability, an abrasion resistance, a light reflection prevention property, a gas barrier property, a UV shielding property, and so forth, and thus, the organic light emitting layers 60, the cathode 50, and the gas barrier layer 30 can be protected by the surface protection layer 206. Thus, the service life of the light emitting element can be increased.

Moreover, the adhesion layer 205 has a function of buffering mechanical impacts. If an external mechanical impact is applied, the adhesion layer relaxes the mechanical impact which is given to the gas barrier layer 30 and the light emitting elements on the inner side. Thus, the function of the light emitting elements can be prevented from being degraded, which will occur due to the mechanical impact.

Also, the adhesion layer 205 may contain fine particles 207. For the adhesion layer 205 which contains the fine particles 207, the fine particles 207 function as a spacer, and the film-thickness of the adhesive layer 205 can be made substantially uniform. Moreover, the fine particles 207 function as an optical waveguide, so that the efficiency at which light is taken out from the organic light emitting layer 60 can be enhanced. Moreover, the fine particles 207, if they are flexible, can function so as to relax a stress applied from the outside. Preferably, the fine particles 207 are the same as the above-described fine articles 211. Also, in this case, the particle sizes need not be uniform. For example, the particle sizes of the fine particles 207 which function as a spacer may be set at 1000 nm, while that of the fine particles 207 which function as an optical waveguide may be set at 10 nm.

As described above, the EL display device is produced.

In the above-described EL display device 1, the buffer layer 210 is arranged between the cathode 50 and the gas barrier layer 30. The buffer layer 210 covers the cathode 50, and the formed upper surface thereof is substantially flat. Thus, the buffer layer 210 is effective in relaxing stress which is generated by distortion or volume-expansion on the substrate 200 side, and moreover, can prevent the cathode 50 from being peeled off from the organic bank layers 221 which are unstable.

Moreover, since the upper surface of the buffer layer 210 is substantially flat, the gas barrier layer 30 of a rigid coat formed on the buffer layer 210 becomes flat. As a result, sites where stress may concentrate are eliminated from the gas barrier layer 30. Thereby, the gas barrier layer 30 can be prevented from cracking.

The frame 215 is provided when the buffer layer 210 is formed. Thus, the buffer layer 210 can be formed in the predetermined area. In particular, since the viscosity of the buffer layer material is adjusted to be low, the fluidity is high. However, the buffer layer material is dammed by the frame 215, i.e., is prevented from flowing out of the predetermined area.

Also, the frame 215 is formed with an organic resin similarly to the buffer layer 210. Therefore, stress-concentration in the gas barrier layer 30 can be prevented.

Furthermore, in the formation of the buffer layer 210 and the frame 215, the heating curing process can be simultaneously carried out. Thus, the working efficiency is enhanced.

Moreover, according to the EL display device 1, the following sealing effect can be obtained.

The EL display device was left to stand in an environment of 90% RH at 60° C., and the time till a dark spot (non-light-emitting region) was generated was determined. The film-thicknesses of the cathode protection layer 55 (silicon oxide), the buffer layer 210, and the gas barrier layer 30 were 50 nm, 3 µm, and 100 nm, respectively.

For the buffer layer 210 made from an acrylic resin only, the generation of a dark spot was confirmed about 50 to 100 hours after the device was left to stand. On the other hand, for the buffer layer 210 made from a material comprising an organic polymer having a nitrogen atom incorporated in the principal chain, e.g., a polymer produced by polymerization of an isocyanate compound with an acrylic resin, a dark spot was generated about 400 to 500 hours after the device was left to stand.

Subsequently, for the buffer layers 210 made from the isocyanate compound and the acrylic resin, the sealing effects were compared when the cathode protection layer 55 was provided or not. When the cathode protection layer 55 was not provided, a dark spot was generated about 50 to 100 hours after the device was left to stand. On the other hand, when the cathode protection layer 55 was provided, about 400 to 500 hours had passed until a dark spot was generated.

Moreover, the drying (solidification) in the step of forming the buffer layer 210 was under conditions of an atmospheric pressure and a steam partial pressure of about 1200 Pa, about 200 to 300 hours had passed until a dark spot was generated. On the other hand, to remove water or solvent adhering to the substrate or remaining in the material for the buffer layer, the pressure was reduced to about 1000 Pa, and then, nitrogen gas was introduced, so that the steam partial pressure was about 0.2 Pa.

When the drying (solidification) was carried out under conditions of an atmospheric pressure and a steam partial pressure of about 0.2 Pa, about 400 to 500 hours had passed until a dark spot was generated.

As seen in the above-description, according to the EL display device of this embodiment, a high sealing effect can be obtained. Thus, the service life of the device can be increased.

Moreover, in the above embodiment, the top emission type EL display device 1 was described as an example. The present invention is not restricted to the top emission type EL display device 1, and can be applied to a bottom emission type display device and also a display device of such a type that emitted light is caused to exit from both of the sides.

In the case of a bottom emission type display device or a display device of such a type that emitted light is caused to exit from both of the sides, regarding switching TFTs 112 and driving TFTs 123 formed on the substrate 200, preferably, these TFTs are formed not directly under the light emitting elements but directly under the organic bank layers 221, so that the opening ratio can be increased.

In the EL display device 1, the first electrode according to the present invention functions as an anode, and the second electrode functions as a cathode. Reversely, the first electrode may be caused to function as a cathode, and the second electrode may be caused to function as an anode. In this case, it is necessary to exchange the positions where the light emitting layers 60 and the hole transport layers 70.

According to this embodiment, as an example of the electro-optical device, the EL display device 1 is applied. The present invention is not restricted to the EL display device 1. Basically, the present invention can be applied to any type of electro-optical device, provided that the second electrode is provided on the outer side of the substrate.

[Second Embodiment]

Hereinafter, a second embodiment of the EL display device will be described. The same members, positions, and elements as those of the first embodiment are designated by the same reference numerals. The description thereof is not repeated.

The EL display device 6 uses a frame 216 instead of the frame 215 of the EL display device 1. The frame 216 is formed with the same material as that for the organic bank layers 221. Since the frame 216 and the organic bank layers 221 are formed with the same materials, both of them can be produced by the same process. Thus, the production process or the like can be simplified.

In the EL display device 6, a plurality of light emitting elements (organic EL elements) having the pixel electrodes 23, the organic light emitting layers 60, and the cathodes 50 are formed on the substrate 200, and moreover, the buffer layer 210 is formed so as to cover the light emitting elements. Moreover, the frame 216 is formed so as to surround the outer periphery of the buffer layer 210. Thus, when the buffer layer 210 is formed, a material for the buffer layer is prevented from flowing out of the frame 216. The gas barrier layer 30 is formed so as to cover the buffer layer 210 and the frame 216.

The major layer of an electro-optical layer 110 is an organic light emitting layer 60 (electroluminescence layer). A hole injection layer, a hole transport layer, an electron injection layer, an electron transport layer, a hole block layer, and an electron block layer may be provided between two electrode which sandwich the electro-optical layer 110.

The frame 216 is provided in the outer periphery of the buffer layer 210 so as to surround the buffer layer 210. The frame 216 is provided in the outer periphery of the area where the organic bank layers 221 are formed. When the buffer layer 210 is formed, a material for forming the buffer layer, which is placed on the cathode 50 to form the buffer layer 210, comes into contact with the frame 216 and dams the buffer layer material, i.e., prevents the material from flowing out of the frame 216.

Figure 9:
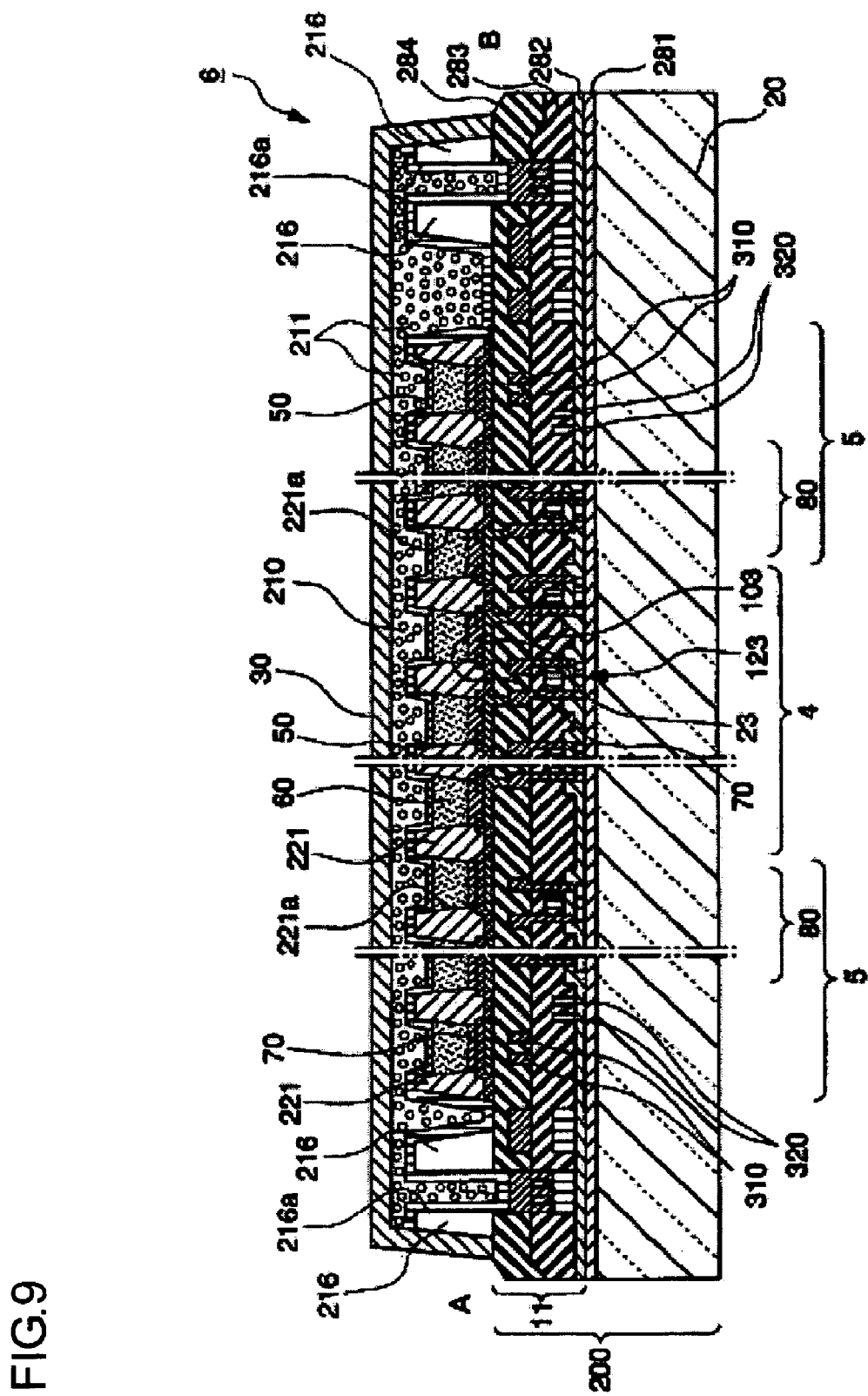
FIG. 9 is a cross-sectional view of an EL display device 6.
Figure 10:
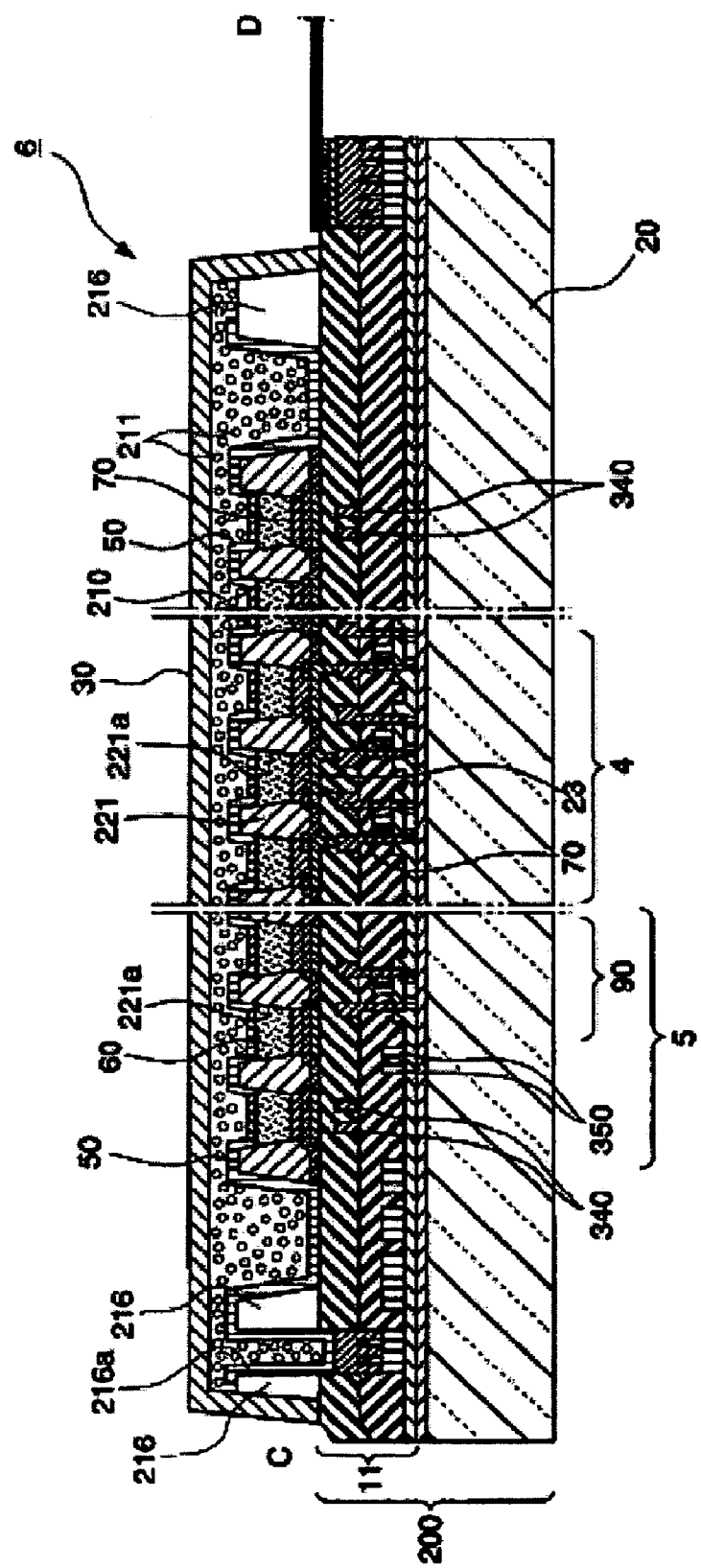
FIG. 10 is a cross-sectional view of an EL display device 6.

It is necessary that the cathode 50 comes in contact with a cathode connection point formed on the substrate 200. Accordingly, the frame 216 is formed in the outer periphery of the area on the outside of the cathode connection point. As shown in FIGS. 9 and 10, the frame 216 may be formed in substantially the same position as that of the cathode connection point, and a contact hole 216a for contacting the cathode 50 and the cathode connection point with each other is provided.

As described above, the frame 216 is formed with the same material as that for the organic bank layers 221. Since the frame 216 and the organic bank layers 221 are formed with the same materials, both of them can be produced by the same process. Thus, the production process or the like can be simplified.

Moreover, the gas barrier layer 30 is formed on the buffer layer 210 and the frame 216 so as to cover them, i.e., so as to prevent them from being exposed. The gas barrier layer 30 is extended onto an insulation layer 284 in the outer periphery of the substrate 200. The gas barrier layer 30 may be formed so as to come into contact with the cathode-protection layer 55 on the insulating layer 284.

Figure 12:
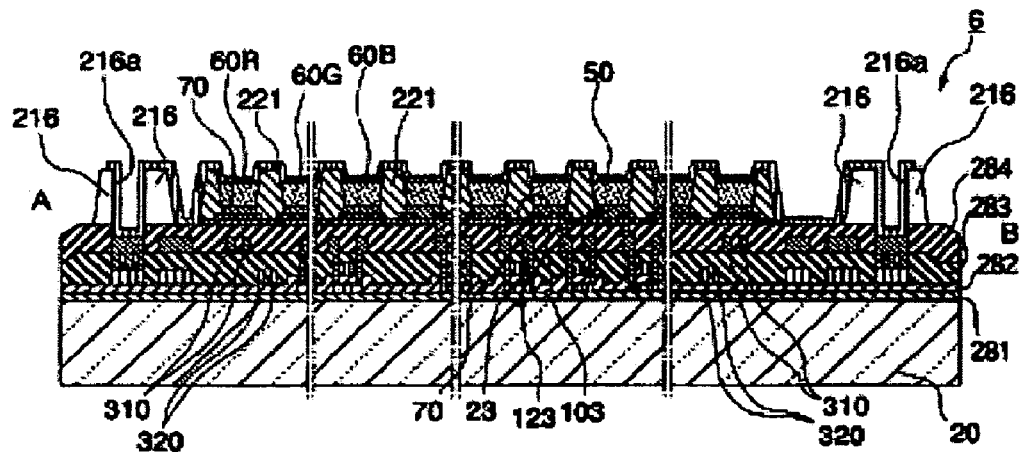
FIG. 12 illustrates the steps succeeding those of FIG. 11.
Figure 12:
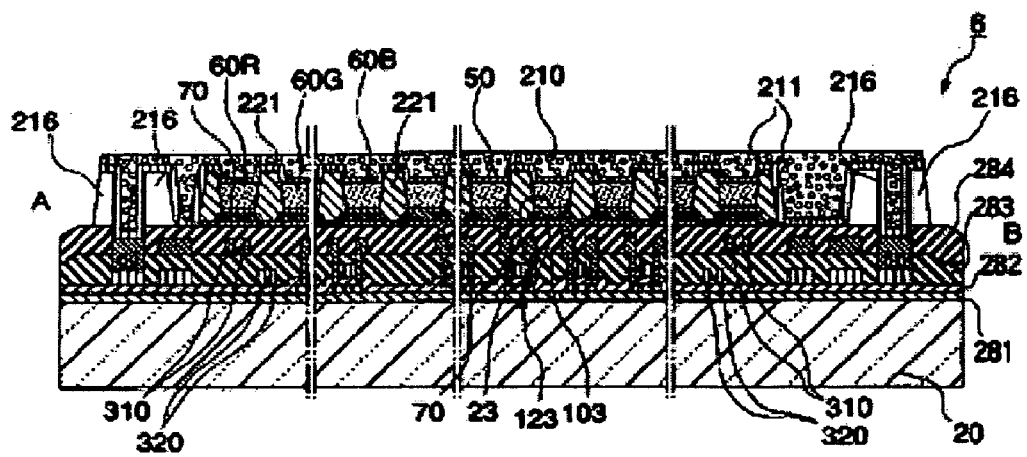
Figure 12:
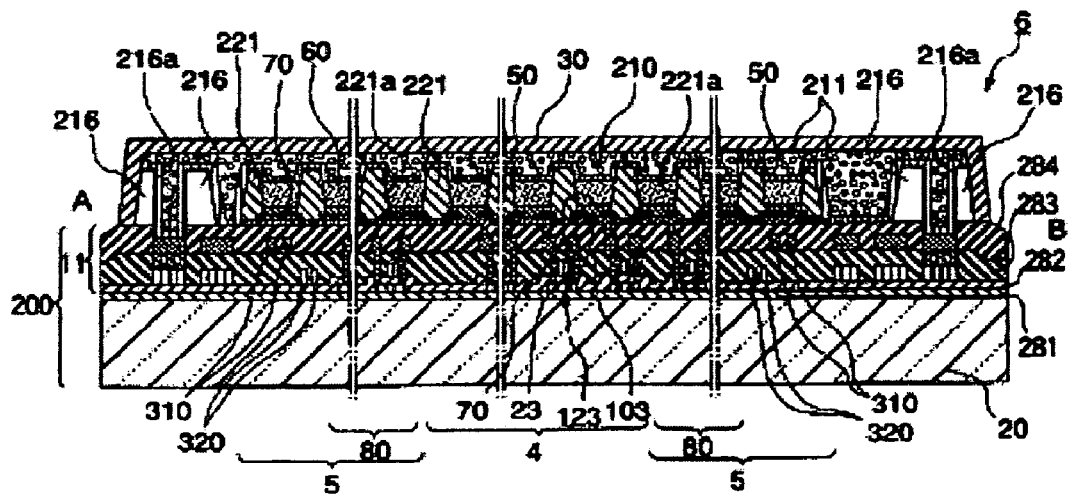
Figure 13:
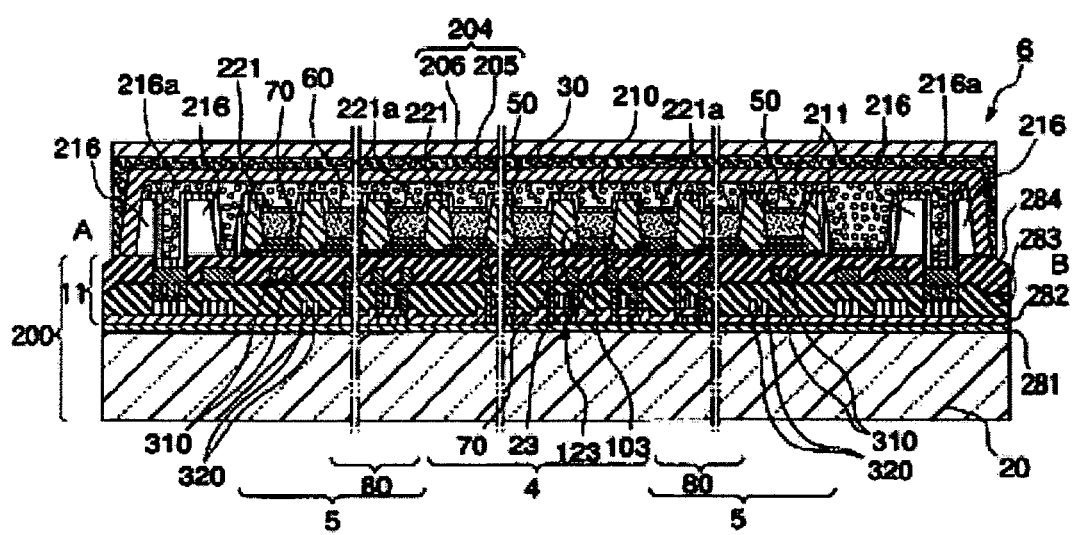
FIG. 13 illustrates the steps succeeding those of FIG. 12.

Hereinafter, an example of a method of producing the EL display device 6 according to this embodiment will be descried with reference to FIGS. 11 to 13.

In this embodiment, the EL display device 6 as an electro-optical device is a top emission type one. Regarding the same process as that according to the first embodiment, the description is simplified or is not repeated.

Figure 11A:
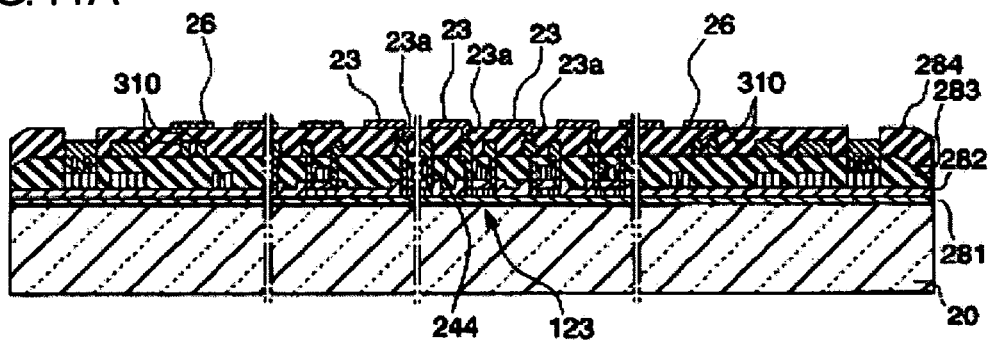
FIG. 11 sequentially shows the steps of the production method for the EL display device 6.
Figure 11B:
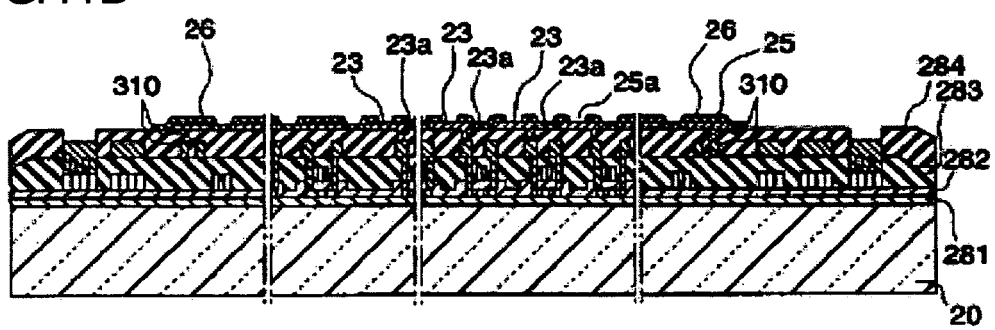

First, the pixel electrodes 23, the liquid-philic property control layers 25, and so forth are formed as shown in FIGS. 11(a) and (b).

Figure 11C:
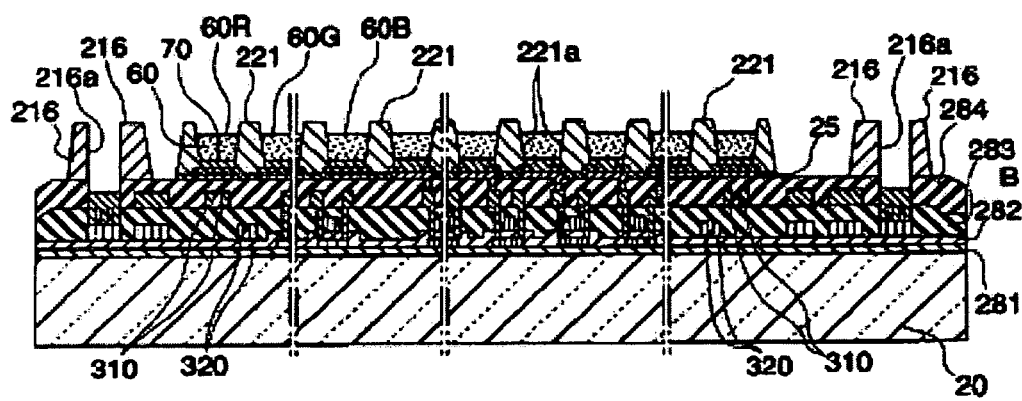

Thereafter, as shown in FIG. 11(c), the organic bank layers 221 are formed in the predetermined positions of the liquid-philic property control layer 25, i.e., so as to cover the above-described BM. Simultaneously, the frame 216 is formed so as to surround the organic bank layers 221.

Specifically, referring to the formation of the organic bank layers 221 and the frame 216, a resist such as acrylic resins, polyimide resins, or the like are dissolved in a solvent and applied substantially onto the whole surface of the substrate 200 by one of different coating methods such as spin coating, slit coating, and the like. Thus, an organic layer is formed. As a material for forming the organic layer, any type of materials may be employed, provided that the materials are insoluble in the solvents of ink described below, and can be easily patterned by etching or the like.

Moreover, the organic layer is patterned by a photolithographic technique and an etching technique, so that the openings 221a are formed in the organic layer. Thus, the organic bank layers 221 having walls in the openings 221a are formed. In this case, the walls defining the openings 221a are formed in such a manner that the angle θ of each wall to the surface of the substrate 200 is in the range of 110° to 170°. In this case, it is defined that the organic bank layer 221 should include at least the pieces positioned above the drive control signal conduction portions 320.

The frame 216 is formed so as to surround the outer periphery of the organic bank layers 221, and also, the contact hole 216a is formed in a predetermined position in the frame 216, simultaneously with the formation of the organic bank layers 221 by using an etching technique.

Subsequently, a region exhibiting a liquid-philic property and a region exhibiting a liquid-repellent property are formed on the surface of each organic bank layer 221. Simultaneously, the surface of the frame 216 is formed so that the surface has a liquid repellent property.

According to this embodiment, the respective regions are formed by plasma-processing. Specifically, the plasma-processing comprises a preheating step. A step of giving the ink-philic property to the upper surfaces of the organic bank layers 221, the walls of the openings 221a, the electrode surfaces 23c of the pixel electrodes 23, and the upper surfaces of the liquid-philic property control layers 25, respectively, a step of giving an ink-repellent property to the upper surface of the organic bank layers 221, the walls of the openings 221a, and the surface of the frame 216, and a cooling step.

Then, in the step of forming a hole transport layer, the hole transport layers 70 are formed. In the step of forming a hole transport layer, a hole transport layer material is coated on the electrode surfaces 23c by a liquid-drop jetting method such as ink jet method or the like, a slit coat method, or the like followed by drying processing and heat treatment. Thus, the hole transport layers 70 are formed on the electrodes 23.

Then, the organic light emitting layers 60 are formed in the step of forming a light emitting layer. In this step, a material for forming a light emitting layer is jetted onto the hole transport layers 70, e.g., by an ink jet method, followed by drying and heat treatment. Thus, the organic light emitting layers 60 are formed in the openings 221a defined by the organic bank layers 221. In the step of forming a light emitting layer, to prevent the hole transport layers 70 from being dissolved again, a non-polar solvent incapable of dissolving the hole transport layers 70 is used as a solvent for use with a material for forming the light emitting layers.

Subsequently, as shown in FIG. 12(d), a cathode 50 is formed in the step of forming a cathode layer. In the step of forming a cathode layer, e.g., a metal such as aluminum, gold, silver, magnesium, or the like or a metal alloy material is formed into the cathode 50 by a vapor phase deposition method such as vacuum vapor phase deposition or the like. In this case, the cathode 5 is formed so as to cover the organic light-emitting layers 60, the organic bank layers 221, and a part of the upper surface of the frame 216 formed in the periphery of the organic bank layers 221. Especially, the cathode 50 is formed so as to cover the contact hole 216a and also to come into contact with the cathode connection point. Moreover, a part of the side-face in the outer periphery of the frame 216 and a part of the upper surface thereof are exposed so that the buffer layer 210 and the frame 216 come into contact with each other.

In the case in which the cathode protection layer 55 is formed on the cathode 50, ITO, titanium oxide, a silicon compound, or the like is formed into a film on the cathode 50 by a high density plasma vapor phase deposition method or the like.

Subsequently, as shown in FIG. 12(e), the buffer layer 210 is formed by a coating method (wet process). The viscosity of the material for forming the buffer layer, which is to be coated onto the cathode 50, is adjusted to not more than 100 mPa·s, preferably, to about 1 to 30 mPa·s, using an organic solvent. When the viscosity of the buffer layer material is adjusted to be low, the buffer layer material sufficiently enters concavities on the surface of the cathode 50. Moreover, the buffer layer material, of which the flow property is high, can be easily formed in such a manner that the upper surface thereof is smooth and continuous. The fine particles 211 is added to the buffer layer material in advance in such an amount as gives a predetermined content.

The buffer layer material is coated on the area surrounded by the frame 216 by a slit coating (or curtain coating) method. Further, the buffer layer material may be coated with an ink jet device. In the case in which the buffer layer is formed by an ink jet method, first, a material for the buffer layer is charged into an ink jet head (not shown). The jet nozzle of the ink jet head is positioned in opposition to the cathode 50. Liquid drops of which the liquid amount per one drop is controlled are jetted to the cathode 50 through the jet nozzle while the ink jet head and the base material (plate 20) are relatively moved.

When the buffer layer material is coated in the area surrounded by the frame 216, the buffer layer material is suppressed from flowing out of the area defined by the fame 216. The buffer layer material of which the fluidity is high tends to be spread out of the coated area. Especially, the area on which the buffer layer material is coated is concave and convex, due to the organic bank layers 221. Thus, the buffer layer material easily flows out through the side-wall portions of the organic bank layers 221. However, the frame 216 processed so as to have a liquid-repellent property and be incompatible with (not having affinity with) water and oil, is disposed on the outside of the organic bank layers 221. Therefore, the buffer layer material can not flow over the frame 216, and is retained in the area defined by the frame 216. When the cathode protection layer is formed with a material having a liquid-philic property, such as an oxide, a difference is caused between the liquid-philic properties of the cathode protection layer 55 and the frame 216. Therefore, the buffer layer material can be selectively coated onto the area where the cathode protection layer 55 surround by the frame is formed. Examples of the oxide include electroconductive oxides such as ITO, titanium oxide, tin oxide, or the like and silicon oxides.

Subsequently, a drying (curing) process is carried out, in which the buffer layer material coated on the cathode 50 is dried (cured). Referring to the curing conditions, the buffer layer material is heated at a temperature less than 120° or irradiated with light under an atmosphere or reduced pressure. Thereby, organic solvents added for adjustment of the viscosity, water absorbed in the material itself, and the like are evaporated off, and the curing proceeds. Thus, the buffer layer 210 is formed.

As described above, the buffer layer 210 is cured by heating at a temperature less than 120° C. or light-irradiation as described above. Thus, the organic light emitting layer 60 is prevented from being heated at a temperature higher than the upper limit for the heat resistance. Thus, the satisfactory organic light emitting layers 60 can be obtained.

Thereafter, as shown in FIG. 12(f), the gas barrier layer 30 is formed so as to cover the cathode 50, the buffer layer 210, and the frame 216, i.e., so as to cover all of the exposed portions of the cathode 50 on the substrate 200.

Referring to the formation of the gas barrier layer 30, a silicon compound such as silicon oxide nitride or the like is formed by a high density plasma vapor phase deposition method.

As shown in FIG. 13(g), the protection layer 204 comprising the adhesion layer 205 and the surface protection layer 206 are formed on the gas barrier layer 30. The adhesion layer 205 is uniformly coated on the gas barrier layer 30 by a screen printing method, a slit coating method or the like. Then, the surface protection layer 206 is bonded thereon.

As described above, the EL display device 6 is produced.

In the above-described EL display device 6, the buffer layer 210 is arranged between the cathode 50 and the gas barrier layer 30. The buffer layer 210 covers the cathode 50, and the formed upper surface thereof is substantially flat. Thus, the buffer layer 210 is effective in relaxing stress which is generated by distortion or volume-expansion on the substrate 200 side, and moreover, can prevent the cathode 50 from being peeled off from the organic bank layers 221 which are unstable.

Moreover, since the upper surface of the buffer layer 210 is substantially flat, the gas barrier layer 30 of a rigid coat formed on the buffer layer 210 becomes flat. As a result, sites where stress may concentrate are eliminated from the gas barrier layer 30. Thereby, the gas barrier layer 30 can be prevented from cracking.

The frame 216 is provided when the buffer layer 210 is formed. Thus, the buffer layer 210 can be formed in the predetermined area. In particular, since the viscosity of the buffer layer material is adjusted to be low, the fluidity is high. However, the buffer layer material is dammed by the frame 216, i.e., is prevented from flowing out of the predetermined area.

[Third Embodiment]

Hereinafter, a third of the EL display device will be described. The same members, positions, and elements as those of the first and second embodiments are designated by the same reference numerals. The description thereof is not repeated.

The EL display device 7 uses a liquid repellent layer 217 instead of the frames 215 and 216. The frames 215 and 216 are mechanical members which dam the buffer layer material, i.e., prevent the material from flowing out of the predetermined area. On the other hand, the liquid repellent layer 217 dams the buffer layer material from flowing out of the predetermined area by utilization of chemical action.

Figure 14:
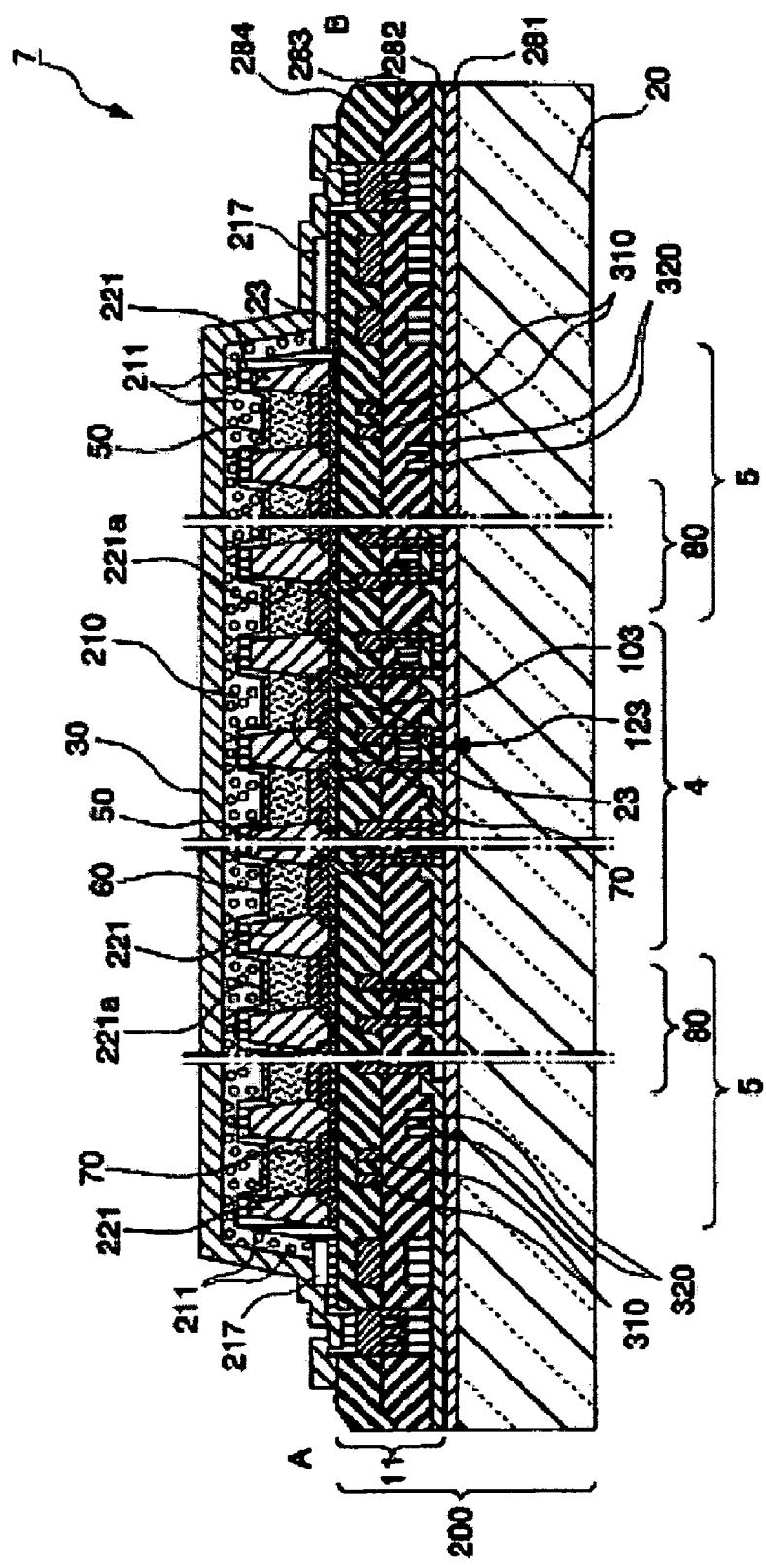
FIG. 14 is a cross-sectional view of an EL display device 7.
Figure 15:
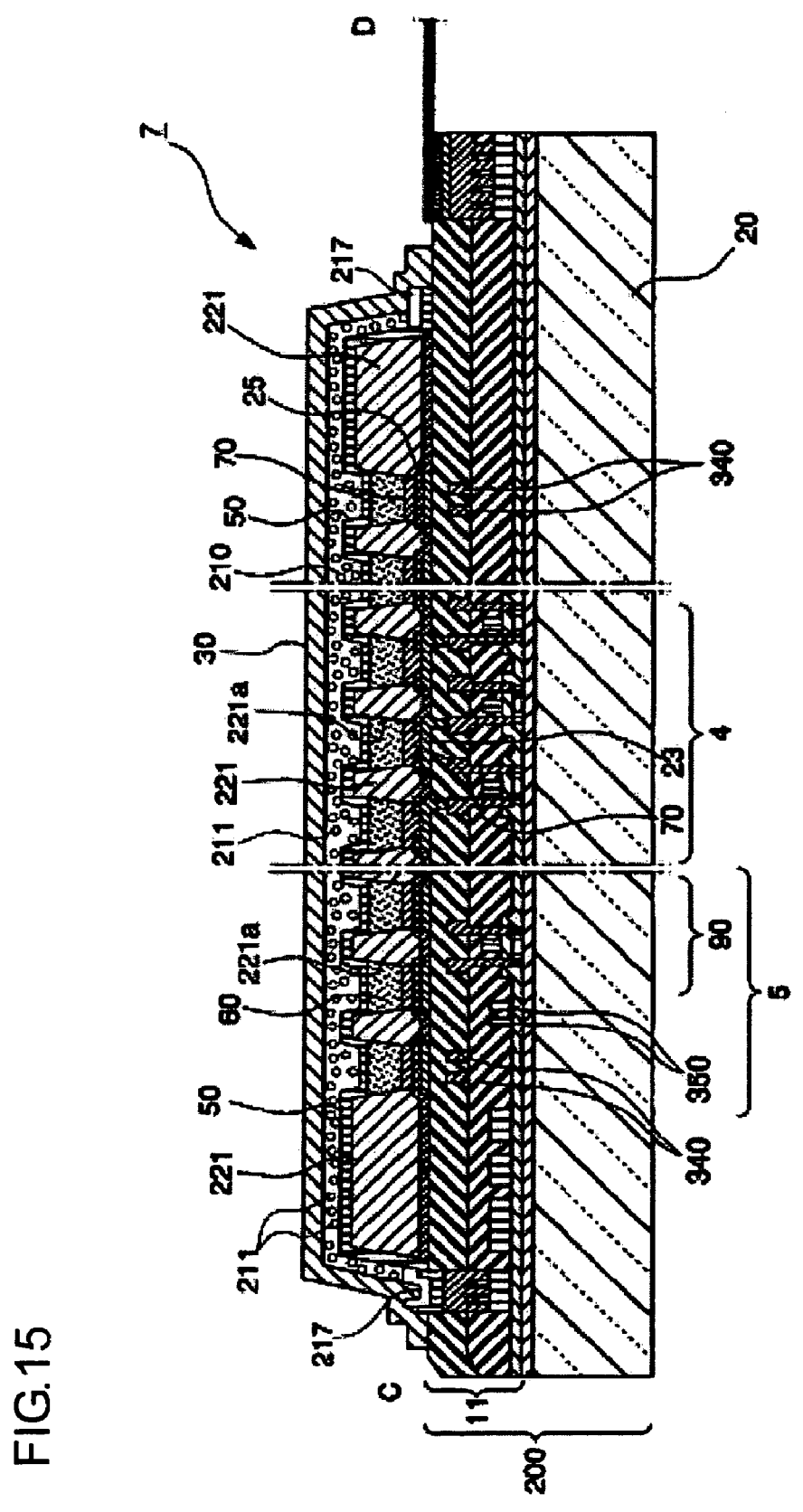

In the EL display device 7, a plurality of light emitting elements (organic EL elements) having the pixel electrodes 23, the organic light emitting layers 60, and the cathodes 50 are formed on the substrate 200, and moreover, the buffer layer 210, the gas barrier layer 30, and so forth are formed so as to cover the light emitting elements, as show in FIGS. 14 and 15.

Moreover, the liquid repellent layer 217 is formed so as to surround the outer periphery of the buffer layer 210. Thus, when the buffer layer 210 is formed, a material for the buffer layer is prevented from flowing out of the liquid repellent layer 217. The gas barrier layer 30 is formed so as to cover the buffer layer 210 and the liquid repellent layer 217.

The major layer of an electro-optical layer 110 is an organic light emitting layer 60 (electroluminescence layer). A hole injection layer, a hole transport layer, an electron injection layer, an electron transport layer, a hole block layer, and an electron block layer may be provided between two electrode which sandwich the electro-optical layer 110.

The liquid repellent layer 217 is provided in the outer periphery of the buffer layer 210 so as to surround the buffer layer 210. The liquid repellent layer 217 is provided in the outer periphery of the area where the organic bank layers 221 are formed. When the buffer layer 210 is formed, a material for forming the buffer layer, which is placed on the cathode 50 to form the buffer layer 210, dams the buffer layer material, i.e., prevents the material from flowing out of the predetermined area, that is, out of the liquid repellent layer 217.

Preferably, the liquid repellent layer 217 is a monomolecular layer containing fluorine atoms. As the liquid repellent layer 217, a monomolecular layer containing fluorine atoms and having a-liquid-repellent property (water-repellent and oil-repellent properties) is formed. Thus, the liquid repellent layer 217 is incompatible with the buffer layer material and can dam the buffer layer material. Moreover, the liquid repellent layer 217 has a heat resistance, a resistance to chemicals, an anti-abrasion property, and so forth. Thus, the water-repellent property can be kept for a long time-period. Moreover, the liquid repellent layer 217 has an electric insulation property. Thus, the liquid repellent layer 217 can be suitably applied onto the cathode 50 or the cathode protection layer 55.

The liquid repellent layer 217 is a monomolecular layer. Thus, preferably, the thickness is in the range of 0.1 to 10 nm.

Moreover, the gas barrier layer 30 is formed on the buffer layer 210 and the liquid repellent layer 217 so as to cover them, i.e., so as to prevent them from being exposed. The gas barrier layer 30 is extended onto an insulation layer 284 in the outer periphery of the substrate 200. The gas barrier layer 30 may be formed so as to come into contact with the cathode-protection layer 55 on the insulating layer 284.

Hereinafter, an example of a method of producing the EL display device 7 according to this embodiment will be descried with reference to FIGS. 16 to 18.

In this embodiment, the EL display device 7 as an electro-optical device is a top emission type one. Regarding the same process as that according to the first embodiment, the description is simplified or is not repeated.

Figure 16A:
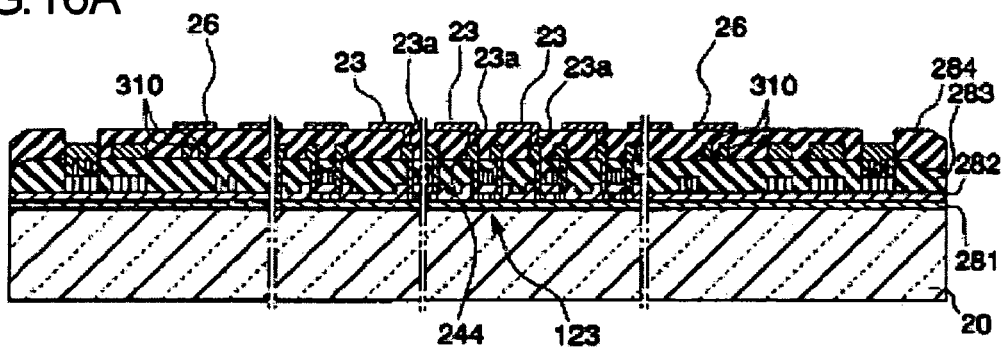
FIG. 16 sequentially shows the steps of the production method for the EL display device 7.
Figure 16B:
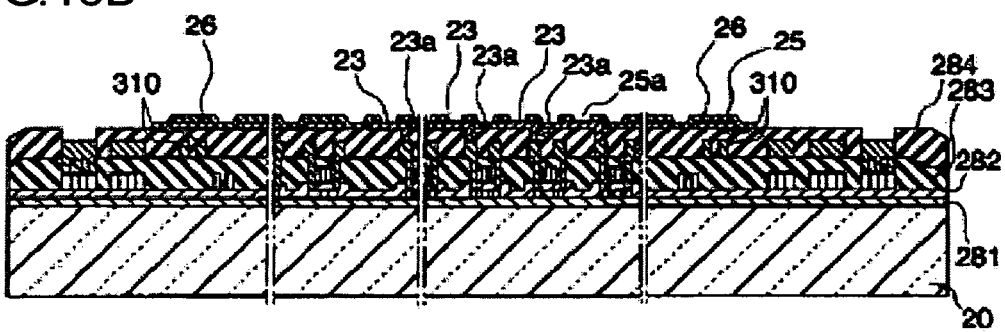
Figure 16C:
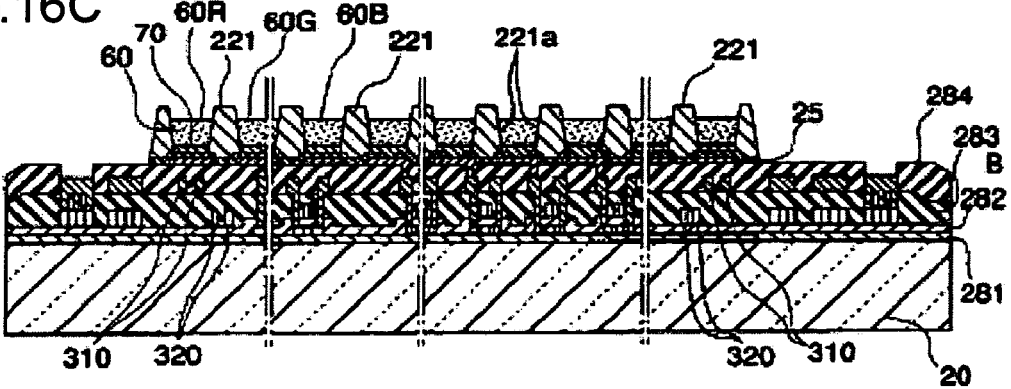

First, the production process illustrated in FIG. 16(a) to (c) is the same as that of the first embodiment.

Figure 17D:
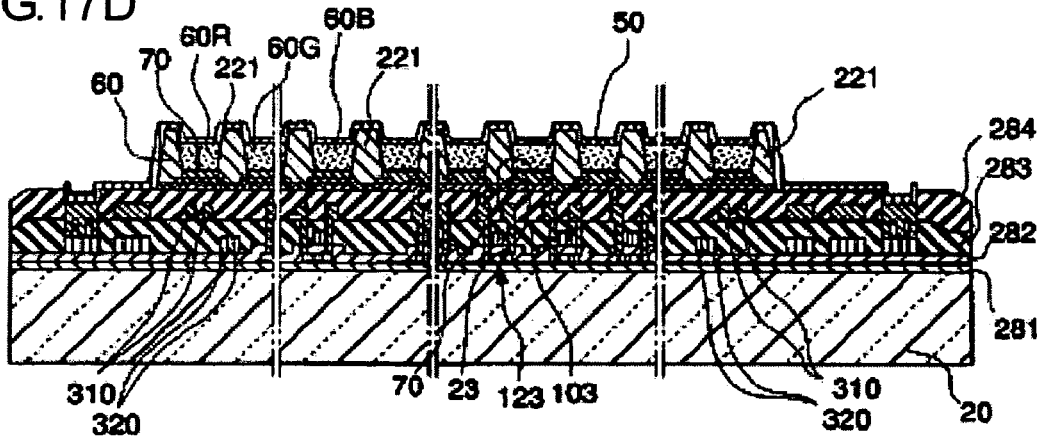
FIG. 17 shows the steps succeeding those of FIG. 16.
Figure 17E:
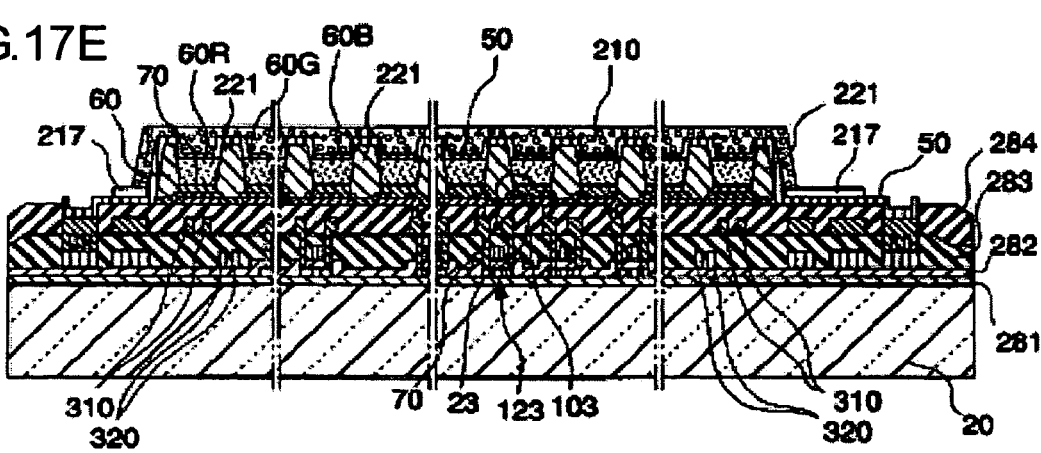

As seen in FIG. 17(d), the cathode 50 is formed, and then, the cathode protection layer 55 is formed on the cathode 50. Thereafter, as shown in FIG. 17(e), the liquid repellent layer 217 is formed on the cathode 50.

Referring to the formation of the liquid repellent layer 217, a silicon compound such as an alkoxysilane having a fluorine atom, e.g., trifluoropropyl trimethoxysilane, heptadecatrifluorodecyl trimethoxysilane or the like is formed on the cathode 50 by coating, a vapor phase deposition method or the like. In another way, an organic monomolecular layer is formed on the cathode 50 using an alkoxysilane such as hexamethyl disilazane, methyl trimethoxysilane, or the like. Then, the fluorine atoms having a liquid repellent property are arranged on the cathode 50 in order and tightly so as to surround the organic bank layers 221.

The liquid repellent layer 217 with a width of 5 to 6 mm is applied continuously and in a ring pattern so as to surround the area where the organic bank layers 221.

Figure 17F:
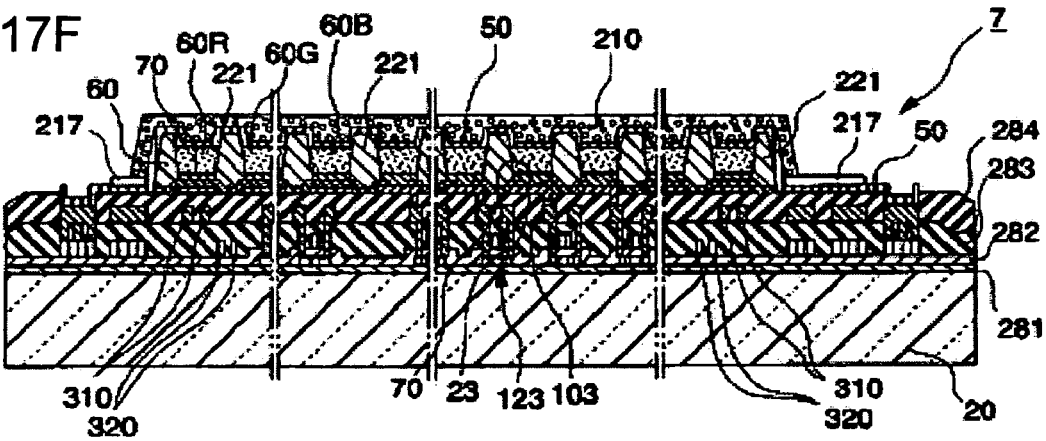

Subsequently, as shown in FIG. 17(f), the buffer layer 210 is formed by a coating method (wet process).

The viscosity of the material for forming the buffer layer, which is to be coated onto the cathode 50, is adjusted to not more than 100 mPa·s, preferably, about 1 to 30 mPa·s, using an organic solvent. When the viscosity of the buffer layer material is adjusted to be low, the buffer layer material sufficiently enters concavities on the surface of the cathode 50. Moreover, the buffer layer material, of which the flow property is high, can be easily formed in such a manner that the upper surface thereof is smooth and continuous. The fine particles 211 is added to the buffer layer material in advance in such an amount as gives a predetermined content.

The buffer layer material is coated on the area surrounded by the liquid repellent layer 217 by a slit coating (or curtain coating) method or a screen-printing method. Further, the buffer layer material may be coated with an ink jet device. In the case in which the buffer layer is formed by an ink jet method, first, a material for the buffer layer is charged into an ink jet head (not shown). The jet nozzle of the ink jet head is positioned in opposition to the cathode 50. Liquid drops of which the liquid amount per one drop is controlled are jetted to the cathode 50 through the jet nozzle while the ink jet head and the base material (plate 20) are relatively moved.

When the buffer layer material is coated in the area surrounded by the liquid repellent layer 217, the buffer layer material is suppressed from flowing out of the area defined by the liquid repellent layer 217. The buffer layer material of which the fluidity is high tends to be spread out of the coated area. Especially, the area on which the buffer layer material is coated is concave and convex, due to the organic bank layers 221. Thus, the buffer layer material easily flows out through the side-wall portions of the organic bank layers 221. However, a liquid -repellent thin film (the liquid repellent layer 217) having a liquid-repellent property and being incompatible with (not having affinity with) water and oil, is disposed on the outside of the organic bank layers 221. Therefore, the buffer layer material can not flow over the liquid repellent layer 217, and is retained in the area defined by the liquid repellent layer 217.

Subsequently, a drying (curing) process is carried out, in which the buffer layer material coated on the cathode 50 is cured. Referring to the curing conditions, organic solvents and water are removed under a very low pressure, ad the buffer layer material is heated at a temperature less than 120° C. or irradiated with light. Thereby, organic solvents added for adjustment of the viscosity are evaporated off. Thus, the buffer layer 210 is formed.

As described above, the buffer layer 210 is cured by heating at a temperature less than 120° C. or by light-irradiation. Thus, the organic light emitting layer 60 is prevented from being heated at a temperature higher than the upper limit temperature for the heat resistance. Thus, the satisfactory organic light emitting layers 60 can be obtained.

Figure 18G:
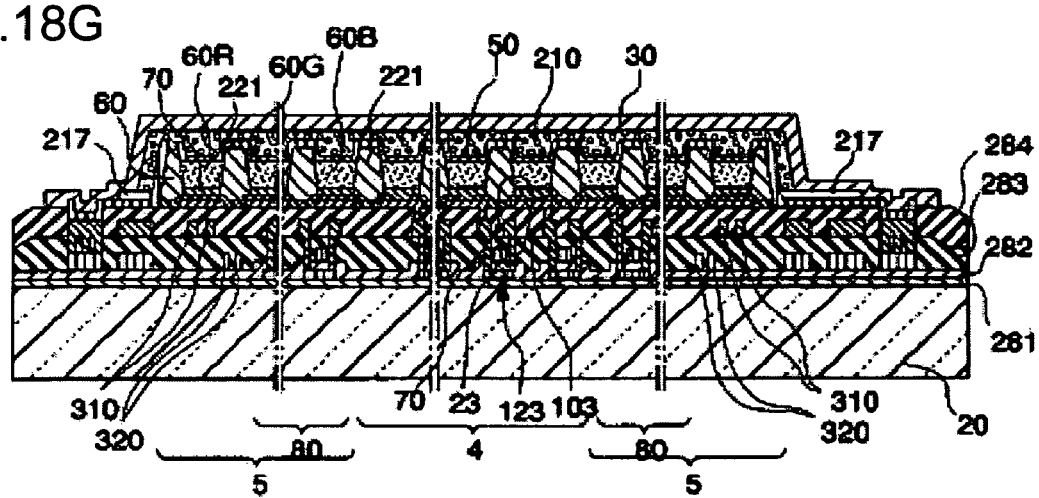
FIG. 18 shows the steps succeeding those of FIG. 17.

Thereafter, as shown in FIG. 18(g), the gas barrier layer 30 is formed so as to cover the cathode 50, the buffer layer 210, and the liquid repellent layer 217, i.e., so as to cover all of the exposed portions of the cathode 50 on the substrate 200.

Referring to the formation of the gas barrier layer 30, a silicon compound such as silicon oxide nitride or the like is formed by a high density plasma vapor phase deposition method.

Moreover, regarding the formation of the gas barrier layer 30, the gas barrier layer 30 may be formed as a monolayer using a silicon compound as described above. Moreover, the gas barrier layer 30 may be formed so as to be made up of at least two, i.e., plural layers laminated together using a combination of a silicon compound and a material different from the silicon compound. Furthermore, the gas barrier layer 30 may be formed as a single layer in which the composition is changed continuously or discontinuously in the thickness direction.

Figure 18H:
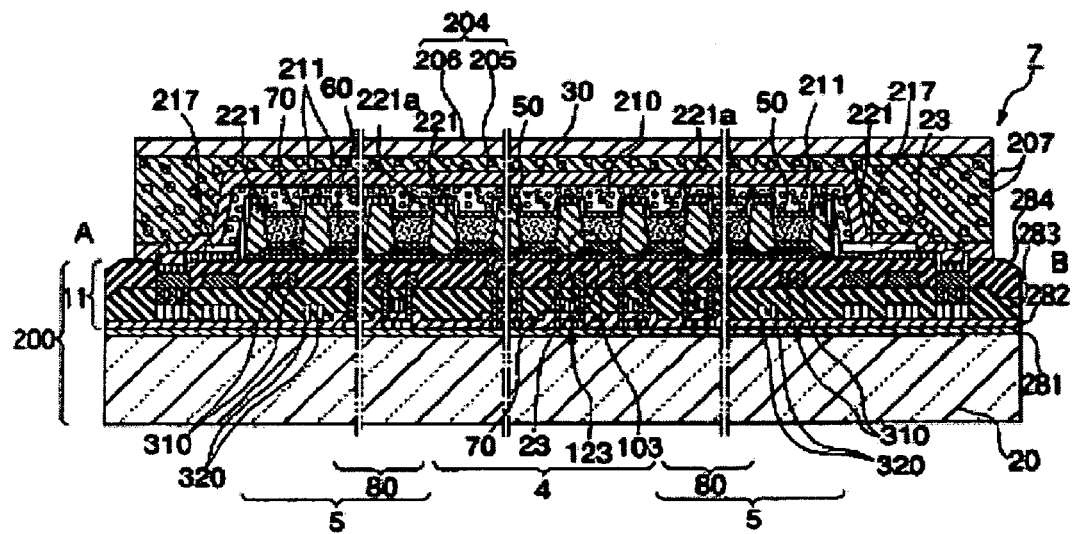

As shown in FIG. 18(h), the protection layer 204 comprising the adhesion layer 205 and the surface protection layer 206 are formed on the gas barrier layer 30. The adhesion layer 205 is uniformly coated on the gas barrier layer 30 by a screen printing method, a slit coating method or the like. Then, the surface protection layer 206 is bonded thereon.

As described above, the EL display device 7 is produced.

In the above-described EL display device 7, the buffer layer 210 is arranged between the cathode 50 and the gas barrier layer 30. The buffer layer 210 covers the cathode 50, and the formed upper surface thereof is substantially flat. Thus, the buffer layer 210 is effective in relaxing stress which is generated by distortion or volume-expansion on the substrate 200 side, and moreover, can prevent the cathode 50 from being peeled off from the organic bank layers 221 which are unstable.

Moreover, since the upper surface of the buffer layer 210 is substantially flat, the gas barrier layer 30 of a rigid coat formed on the buffer layer 210 becomes flat. As a result, sites where stress may concentrate are eliminated from the gas barrier layer 30. Thereby, the gas barrier layer 30 can be prevented from cracking.

The liquid repellent layer 217 is provided when the buffer layer 210 is formed. Thus, the buffer layer 210 can be formed in the predetermined area. In particular, since the viscosity of the buffer layer material is adjusted to be low, the fluidity is high. However, the buffer layer material is dammed by the liquid repellent layer 217, i.e., is prevented from flowing out of the predetermined area.

[Fourth Embodiment] Plural Plates

Hereinafter, a fourth embodiment of the EL display device will be described. The same members, positions, and elements as those of the first to third embodiments are designated by the same reference numerals. The description thereof is not repeated.

The EL display devices 1 to 3 each contain the EL display element formed on one plate. On the other hand, a large EL display device 8 is formed by arrangement of plural plates each having an EL display element formed hereon.

Hereinafter, the structure of the EL display device 8 will be described with reference to FIGS. 19 and 20.

Figure 19:
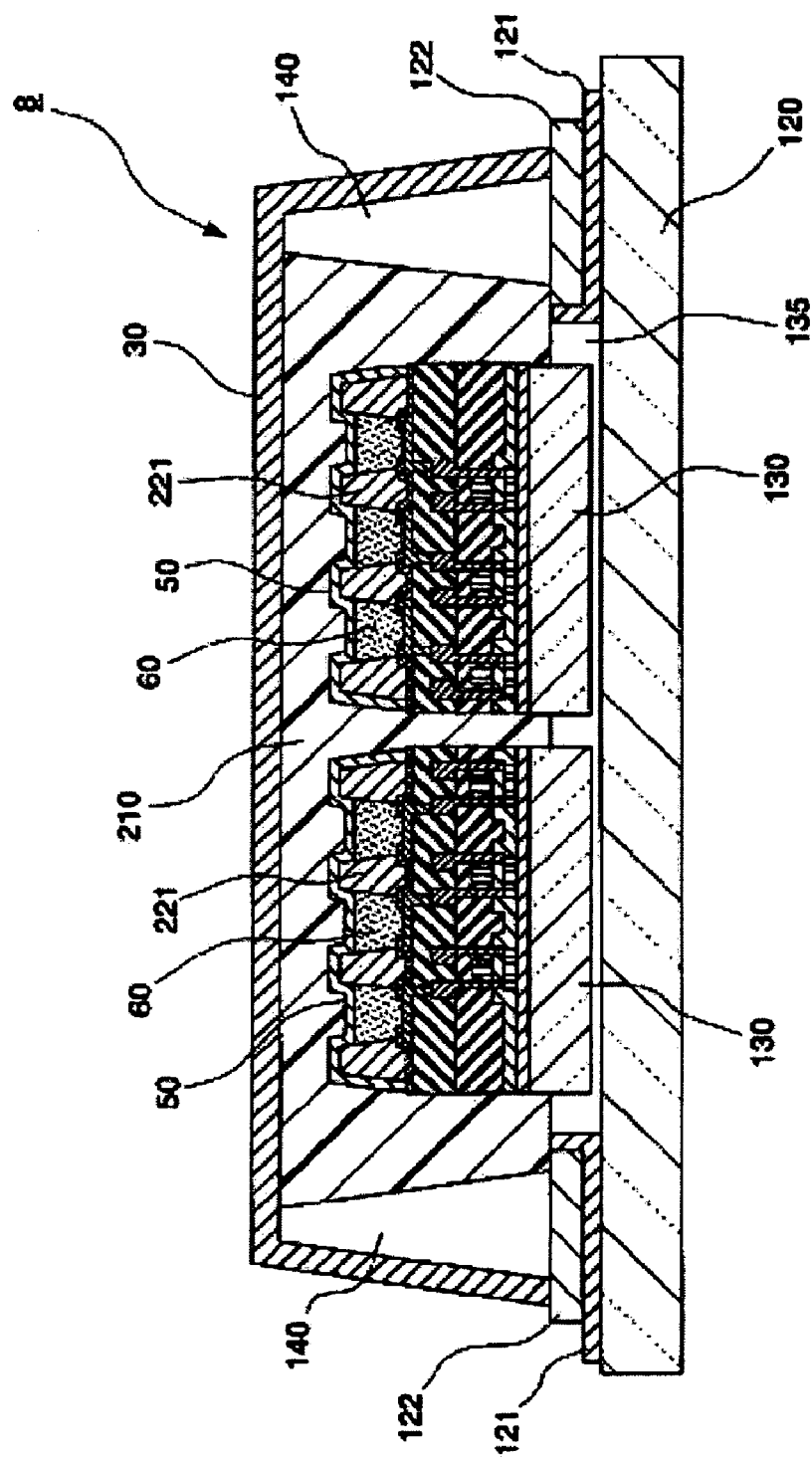
FIG. 19 is a cross-sectional view of an EL display device 8.

FIG. 19 is a cross-sectional view of the EL display device 8. The EL display device 8 comprises plural second plates 130 and a first plate 120 on which the second plates 130 are placed. In each of the second plate 130, a plurality of light emitting elements (organic EL elements) having the pixel electrodes 23, the organic light emitting layers 60, and the cathodes 50 are formed on a plate 20. A wiring (electroconductive layer) 121 and an insulation layer 122 are formed in the outer periphery of the first plate 120. The plural second plates 130 are regularly arranged via an adhesion layer 135 in the center of the first plate 120. A frame 140 is formed so as to surround the plural second plate 130 and have a height larger than that of the second plates 130. A buffer layer 210 is formed on the inner side of the frame 140 so as to cover the plural second plates 130. Moreover, the gas barrier layer 30, the adhesion layer 205, and the surface protection layer 206 are formed so as to cover these members. In the fourth embodiment of the EL display device, the buffer layer 210 corresponds to the buffer layer in the claim.

Moreover, the second plates 130 and the wiring 121 of the first plate 120 are connected to each other via a bonding wire or the like, and are connected to a driver chip and an electric source via the first plate surface.

As shown in FIG. 19, plurality light emitting elements (organic EL elements) are formed on each of the second plates 130. The light emitting element is provided with the pixel electrode 23, the light emitting layer 60, and the cathode 50. The second plates 130 have substantially the sane structure, and are known EL display devices. Thus, the EL display device 8 having a large screen can be formed by means of existing production facilities by regularly arranging the plural second plates 130.

Typically, the light emitting layer 60 (electroluminescence layer) may be a layer provided with a carrier injection layer or a carrier transport layer such as a hole injection layer, a hole transport layer, or an electron transport layer, or may be a layer provided with a hole blocking layer or an electron blocking layer.

The whole of the plate 20 and the switching TFTs, various circuits, interlayer insulating films, and so forth is named a substrate 200. This will be described below.

Figure 20:
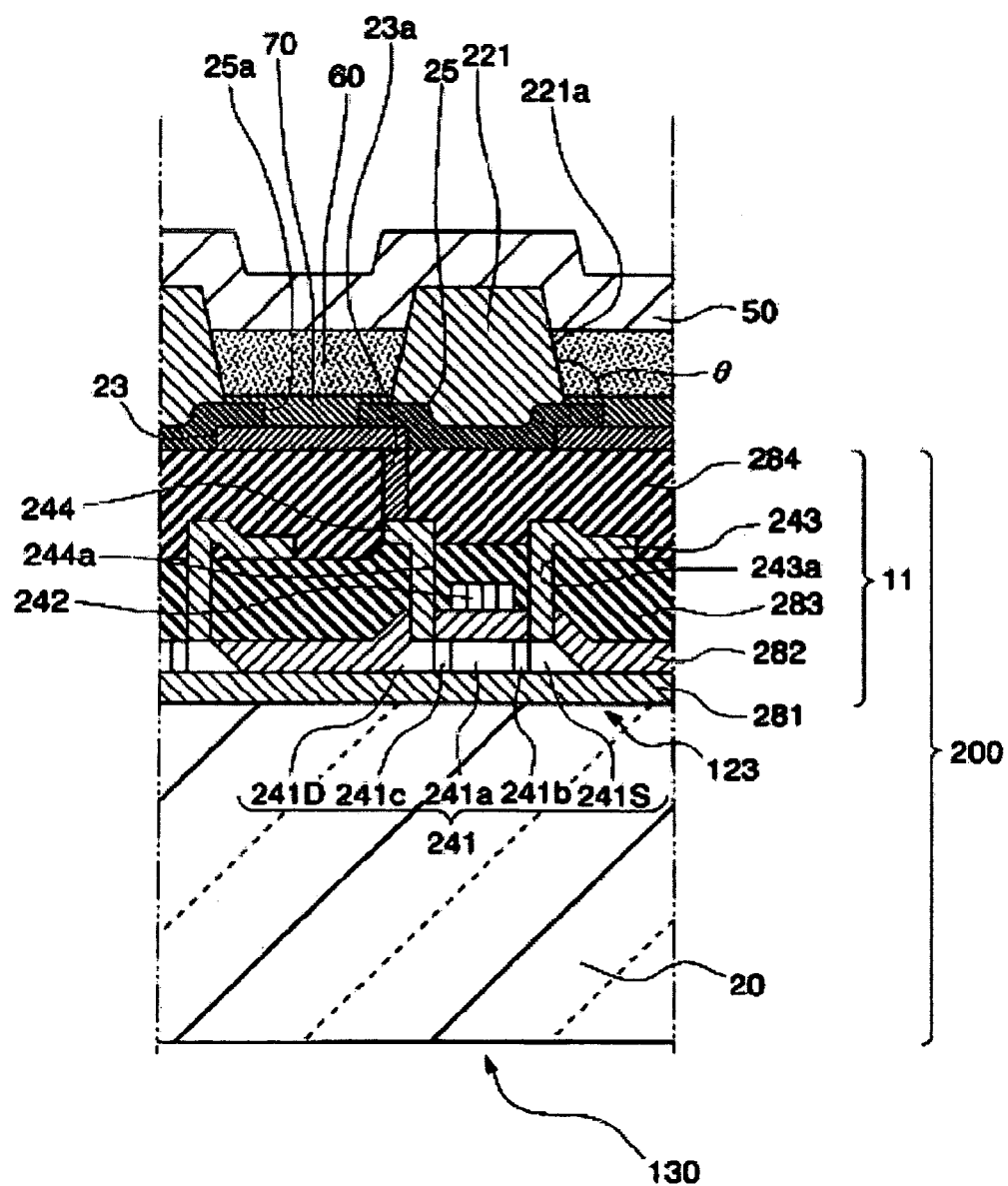
FIG. 20 is an enlarged cross-sectional view of the essential part shown in FIG. 2.

As shown in FIG. 20, in the plate 130, a circuit portion 11 is formed on the plate 20. A plurality of the light emitting elements (organic EL elements) are formed on the circuit portion 11. The light emitting element comprises the pixel electrode 23 which functions as an anode, a hole transport layer 70 through which a hole is injected/transported from the pixel electrode 23, the organic light emitting layer 60 containing an organic EL substance which is one of electro-optical materials, and the cathode 50, which are formed sequentially in that order.

According to the above-described constitution, a hole injected via the hole transport layer 70 couples with an electron via the cathode 50, so that light is emitted in the light organic emitting layer 60 of the light emitting element.

Referring to FIG. 19 again, the second plates 130 are regularly arranged on the first plate 120 via an adhesion layer 135.

As the first plate 120, a transparent plate and an opaque plate can be used.

As an opaque plate, e.g., ceramics such as alumina or the like, metallic sheets of stainless steel or the like insulation-processed by surface-oxidation or the like, plates made of thermosetting resins or thermoplastic resins, films made of the resins (plastic films), and so forth may be used, similarly to the case of he second plates 130.

The frame 140 formed so as to surround the adhesion layer 135 and the plural second plates 130 is formed of an organic layer similarly to the case of the organic bank layers 221.

The adhesion layer 135 is formed with, e.g., urethane type resins, acrylic resins, epoxy resins, olefin resins, or the like. Since the plural second plate 130 are fixed via the resin layer. The heights of the second plates 130 on the first plate 120 become different from each other. Moreover, gaps occur between the second plates 130.

To compensate for the irregularities in height of the second plates 130 and fill the gaps between the second plates 130, the buffer layer 210 is formed on the second plates 130 so as to range over the plates 130 and within the frame 140. The buffer layer 210 fills the concavities and convexities on the upper surface of second plates 130 (convexities and concavities on the upper surface of the cathodes 50) and the gaps between the second plates 130, so that the upper surface of the buffer layer 210 is substantially flat.

The buffer layer 210 has a function of relaxing a stress which is generated due to deflection and the expansion of volume occurring on the substrate 200 side. Thus, the buffer layer 210 prevents the cathode 50 from being peeled from the organic bank layer 221 which are not stable. In addition, since the upper surface of the buffer layer 210 is substantially flat, a gas barrier layer 30 made of a rigid film, which is formed on the buffer layer 210, becomes flat. Thereby, sites on which stress concentrates can be eliminated. Thus, the gas barrier layer 30 can be prevented from cracking.

As a major component of the buffer layer 210, organic compounds such as epoxy resins, acrylic resins, silicone resins, polyurethane, polyether, polyester, or the like are preferable. As these organic compounds, epoxy oligomers, acrylic oligomers, polyurethane, polyester, polymethacrylate, or the like, of which the viscosities are adjusted by dilution with organic solvents and which are mixed with a reactive substance, are applied on the cathode 50 and so forth.

As a reactive substance, an isocyanate compound such as tolylenediisocyanate, xylylenediisocyanate or the like, an alkoxysilane compound such as methyl trimethoxysilane or the like, an amine compound of which the reaction proceeds with moisture, or a photo-polymerization initiator such as aminoketone, hydroxyketone, bisacyl phosphine oxide, or the like are used.

Since the reactive substance is mixed, the reaction can proceed by heating at a relatively low temperature or by light-irradiation. Thus, the buffer layer 210 is cured. As seen in the above-description, the buffer layer 210 can be cured at a temperature which is lower than the upper limit temperature (about 120 to 140° C.) for the heat resistance of the light emitting layer 60. Thus, hazardous influences over the light emitting layer 60, which will occur due to the heating, can be suppressed.

Fine particles which serve for anti-shrinkage of a material for the buffer layer during the drying and polymerization may be added to the material for the buffer layer.

Moreover, the gas barrier layer 30 is formed on the buffer layer 210 so as to cover the frame 140 of first plate 120. The gas barrier layer 30 is provided so that oxygen or water is prevented from intruding into the inner side of the gas barrier layer 30. Thus, the oxygen or water is prevented from intruding into the cathode 50 and the light emitting layer 60. Thus, the deterioration or the like of the cathode 50 and the light emitting layer 60, which will occur due to oxygen or water, can be suppressed.

For example, the gas barrier layer 30 is formed with an inorganic compound, preferably with a silicon compound such as silicon nitride, silicon oxide nitride, silicon oxide, or the like. Moreover, the gas barrier layer 30 may be formed with, e.g., alumina, tantalum oxide, titanium oxide, or other ceramics instead of the silicon compound. In the case in which the gas barrier layer 30 is formed with the inorganic compound, and the cathode 50 is made of, e.g., ITO, the adhesion of the gas barrier layer 30 to the part of the cathode 50 is enhanced. Thus, the gas barrier layer 30 becomes a tight layer without defects, so that the barrier property against oxygen and water is more enhanced.

Further, the gas barrier layer 30 may have a structure in which layers made of e.g., above-described different silicon compounds are laminated to each other. Specifically, preferably, silicon nitride and silicon nitride oxide are formed in that order from the cathode 50 side, or silicon oxide nitride and silicon oxide are formed in that order from the cathode 50 side to produce the gas barrier layer 30. Instead of the above-described combinations, preferably, at least two layers made of silicon oxide nitrides having different composition ratios may be laminated. In this case, preferably, the oxygen concentration of the layer on the cathode 50 side is lower than that of the layer existing on the outer side.

According to the above-described structure, the oxygen concentration on the cathode 50 side is lower than that on the side opposite to the cathode 50 side. Accordingly, oxygen contained in the gas barrier layer 30 can be prevented form passing through the cathode 50 and reaching the light emitting layer 60 positioned on the inner side. Thus, the deterioration of the light emitting layer 60 can be prevented. The service life of the light emitting layer 60 can be increased.

Moreover, the composition of the gas barrier layer 30 may be heterogeneous, not employing a lamination-structure. That is, the oxygen concentration of the gas barrier layer 30 may be changed continuously or discontinuously. In this case, for the above-described reason, preferably, the gas barrier layer 30 is formed so that the oxygen concentration on the cathode 50 side is lower than that on the outer side.

Moreover, preferably, the thickness of the gas barrier layer 30 is in the range of 10 nm to 500 nm. If the thickness is less than 10 nm, perforations may be formed in the part of the gas barrier layer 30 due to film-defects, the dispersion of the film-thickness or the like. Thus, the gas barrier property is damaged. If the film-thickness exceeds 500 nm, the gas barrier layer 30 may be cracked due to stress.

In this embodiment, the display device of this embodiment is a top emission type one. Accordingly, it is necessary for the gas barrier layer 30 to be light-transmissible. Thus, according to this embodiment, the light transmittance is set at, e.g., 80% or higher in the visible range by appropriate selection of the material and the film-thickness of the gas barrier layer 30.

A protection layer 204 is formed on the outer side of the gas barrier layer 30 so as to cover the gas barrier layer 30. The protection layer 204 comprises an adhesion layer 205 formed on the gas barrier layer 30 side and a surface protection layer 206.

The adhesion layer 205 is effective in fixing the surface protection layer 206 onto the gas barrier layer 30, and has a function of buffering mechanical impacts applied from the outside. The adhesion layer 205 is formed with an adhesive of which the material is more flexible and has a lower glass transition point compared with that of the surface protection layer 206. Examples of the material include urethane resins, acrylic resins, epoxy resins, polyolefin resins, or the like.

Preferably, a silane coupling agent, an alkoxysilane, silazane, or the like is added to the above-described adhesive. Thereby, the adhesion of the formed adhesive layer 205 to the gas barrier layer 30 is more enhanced. Accordingly, the buffering function for mechanical impacts becomes greater.

Especially, in the case in which the gas barrier layer 30 is formed with a silicon compound, the silane coupling agent and the alkoxysilane are effective in high adhesion between the adhesive layer 205 and the gas barrier layer 30. Accordingly, the gas barrier property of the gas barrier layer 30 can be enhanced.

The surface protection layer 206 is formed on the adhesion layer 205, and constitutes the surface side of the protection layer 204. The surface protection layer 206 has at least one of the properties of pressure durability, abrasion resistance, an external light reflection preventing property, a gas barrier property, a UV shielding property, and so forth. Specifically, the surface protection layer 206 is a polymer layer (plastic film), a DLC (Diamond-Like Carbon) layer, or is made of glass or the like.

In the case in which the EL display device of this example is a top emission type one, both of the surface protection layer 206 and the adhesion layer 205 are required to be light-transmissible. However, in the case of a bottom emission type EL display device, the above-described requirement is not made.

Hereinafter, an example of a method of producing the EL display device 8 according to this embodiment will be descried with reference to FIGS. 21 and 22.

According to this embodiment, the EL display device 8 as an electro-optical device is a top emission type one.

The process of forming the respective second plates 130, i.e., the process of forming the circuit portions 11, the light emitting layers on the surface of the plate 20, is the same as that according to a know technique. Thus, the description is not repeated.

Figure 21A:
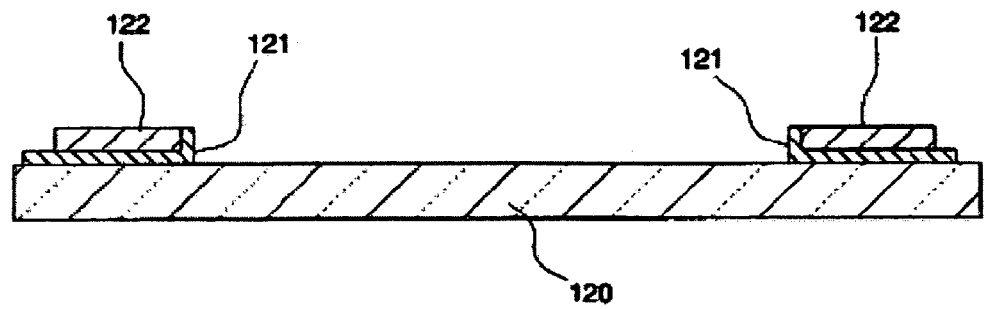
FIG. 21 sequentially shows the steps of the production method for the EL display device 8.

First, as shown in FIG. 21(a), an electro-conductive film to produce a conductive layer 121 is formed so as to cover the whole surface of the first plate 120. Moreover, this transparent electro-conductive film is patterned. Thus, the conductive layer 121 is formed. Thereafter, an insulation layer is formed on the conductive layer 121. The insulation layer 122 is formed by applying an organic material or the like according to an appropriate coating method.

Figure 21B:
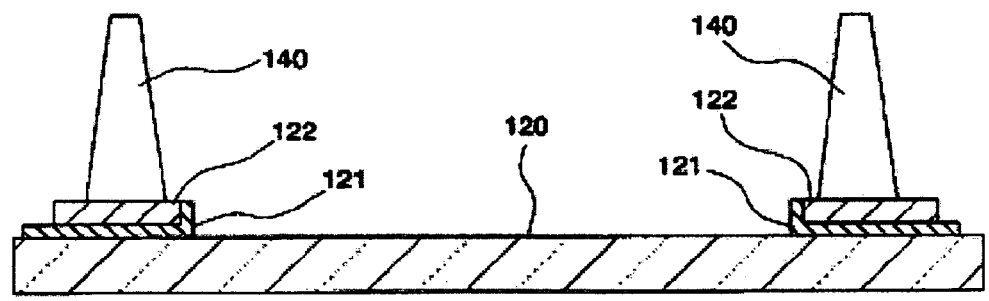

Thereafter, as shown in FIG. 21(b), the frame 140 is formed on the insulation layer 122 of the first plate 120. Specifically, referring to the formation of the frame 140, e.g., a resist of acrylic resins, polyimide resins, or the like is dissolved in a solvent and applied by one of different coating methods such as spin coating, dip coating, and the like. Thus, an organic layer is formed. As a material for forming the organic layer, any type of materials may be employed, provided that the materials are insoluble in the solvents described below, and can be easily patterned by etching or the like.

The frame 140 is formed so as to surround the plural second plates 130 which are to be disposed in the center of the first plate 120 and so as to have a height larger than the second plates 130. This is because the second plates 130 are covered with the buffer layer 210 formed on the inner side of the frame 140.

Figure 21C:
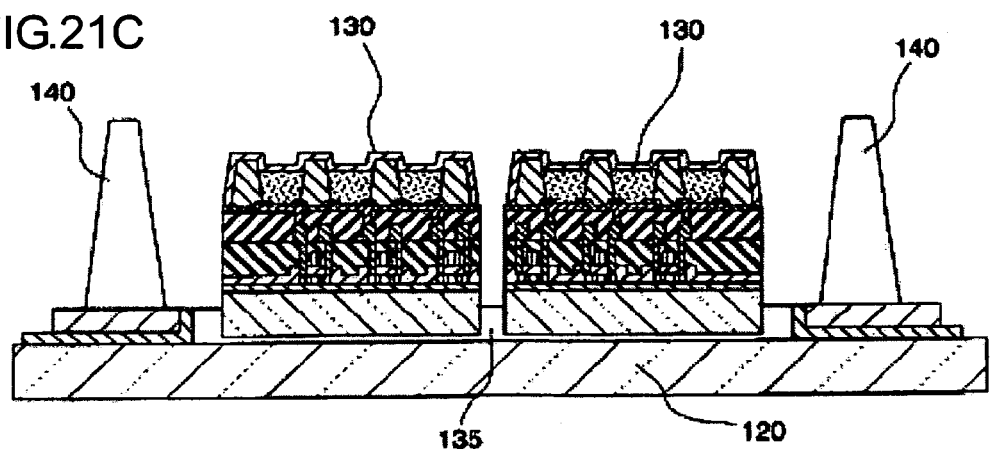

Thereafter, as shown in FIG. 21(c) an adhesion layer 135 is formed by coating in the center of the first plate 120. The adhesion layer 135 is coated in a predetermined position by a coating method. The plural second plates 130 formed in another process are positioned at predetermined intervals, and then, are cured. As curing conditions, heating at a temperature of about 50° C. to 120° C. or light-irradiation is employed. Thereby, a reactive substance contained in the adhesion layer material reacts. Thus, the adhesion layer 135 is cured.

After the adhesion layer 135 is cured, the cathodes 50 on the second plates 130 and the wiring 121 of the first plate 120 are connected to each other by means of a bonding wire or the like.

Figure 22D:
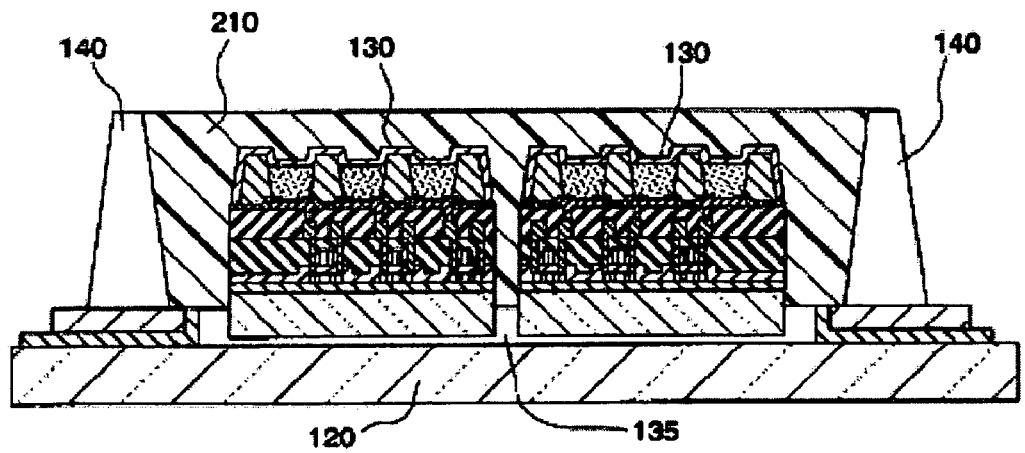
FIG. 22 illustrates the steps succeeding those of FIG. 21.

Subsequently, as shown in FIG. 22(d), the buffer layer 210 is arranged by a coating method, i.e., a wet process. In the case in which the buffer layer is formed by an ink jet method, first, a material for the buffer layer is charged into an ink jet head (not shown). The jet nozzle of the ink jet head is positioned in opposition to the second plates 130. Liquid drops of which the liquid amount per one drop is controlled are jetted onto the second plates 130 through the jet nozzle while the ink jet head and the first plate 120 are relatively moved. Thereafter, the jetted drops are dried, so that the disperse medium or solvent contained in the material for the buffer layer is evaporated off. Thus, the buffer layer 210 is formed. The buffer layer material may be coated (arranged) by a slit coating (or curtain coating) method.

The viscosity of the material for forming the buffer layer, which is to be coated onto the second plates 130, is adjusted to not more than 100 mPa·s, preferably, about 1 to 30 mPa·s, using an organic solvent. When the viscosity of the buffer layer material is adjusted to be low, the buffer layer material sufficiently enters concavities on the surface of the second plates 130. Moreover, the buffer layer material, of which the flow property is high, can be easily formed in such a manner that the upper surface thereof is smooth and continuous. The frame 140 has a height larger than the second plates 130. Thus, the buffer layer material can be sufficiently coated on the second plates 130.

The coating of the buffer layer material is carried out in an environment of which the temperature is controlled. Specifically, the coating is carried out at an environmental humidity of a dew point less than −30° C., preferably, −60° C. When the temperature is set to be up to −30° C., the relative humidity (20° C.) can be maintained at 2% RH or lower. Ordinarily, water can be removed from the buffer layer material by drying under reduced pressure after the coating. For filling the steps between plates, it is required to set the film thickness at a considerably large value. Accordingly, problematically, the pressure-reduction time becomes long, and so forth.

As described above, the buffer layer is set in an environment of which the humidity temperature is controlled, and thereby, the buffer layer material is prevented from absorbing moisture, and the water remaining in the buffer layer can be reduced. Moreover, the progress of the reaction of the reactive substance mixed with the buffer layer material can be suppressed. Thus, the buffer layer material can be maintained in the stable condition for a long time. That is, the buffer layer material mixed with the reactive substance, which rapidly causes a reaction with moisture, is set in a low humidity environment. Thereby, the curing reaction does not proceed, and the buffer layer material is maintained in the stable condition for a long time. Referring to the properties of a photo-polymerization initiator, the initiator, which is activated with light, reacts with water and is deactivated. Therefore, when the buffer layer material mixed with the photo-polymerization initiator is set in a low humidity environment, the curing reaction does not proceed, and the buffer layer material can be kept in the stable condition for a long time.

As described above, the viscosity of the buffer layer material is adjusted, and the coating is carried out in an environment of which the humidity is controlled. Accordingly, the buffer layer 210 is formed so as to cover the second plates 130 and have a smooth, continuous upper surface. Moreover, water adsorbed to the surface of the first plate 120 can be removed. Thus, no water remains in the buffer layer 210.

Subsequently, a drying (curing) process is carried out, in which the buffer layer material coated on the second plates 130 is cured. As curing conditions, heating at a temperature of about 50° C. to 120° C. under reduced pressure (introduction of moisture) or light-irradiation is employed. Thereby, solvents added for the adjustment of the viscosity of the buffer layer material are evaporated off. Also, the curing reaction proceeds with the reactive substance. Thus, the buffer layer 210 is cured.

As described above, the buffer layer 210 is cured by heating at a temperature of about 50° C. to 120° C. (introduction of moisture) or light-irradiation. Thus, the light emitting layers 60 are prevented from being heated at a temperature higher than the upper limit temperature for the heat resistance. Thus, the light emitting layers 60 are satisfactory.

The coating of the buffer layer material may be carried out in an inert gas atmosphere of nitrogen or the like. The buffer layer material can be coated in an environment of which the humidity is reduced by purging the nitrogen gas or the like.

Figure 22E:
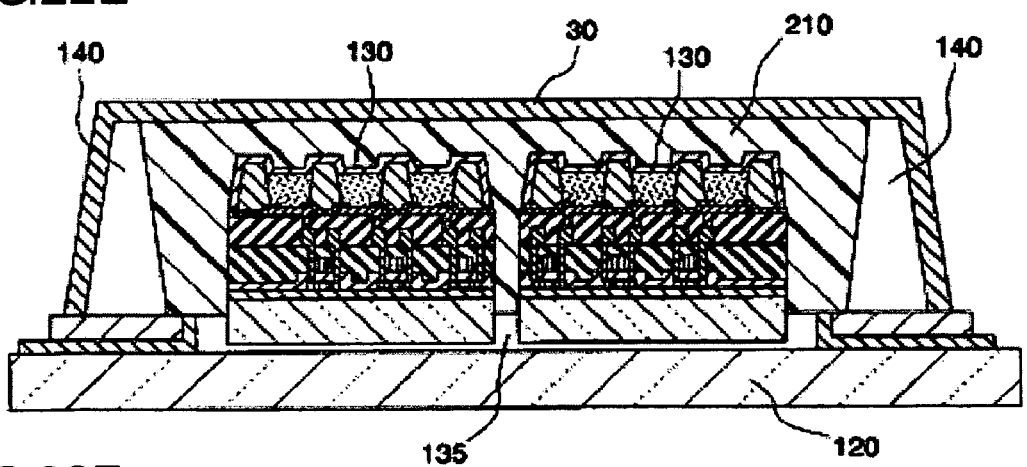

Thereafter, as shown in FIG. 22(e), the gas barrier layer 30 is formed so as to cover the buffer layer 210 and the frame 140.

Referring to the formation of the gas barrier layer 30, the gas barrier layer 30 is formed by a high density plasma vapor phase deposition method. Also, a film is formed by a physical vapor phase deposition method such as sputtering, ion plating, or the like in advance, and then, a film is formed thereon by a chemical vapor phase deposition method such as plasma CVD or the like. The physical vapor phase deposition method such as sputtering, ion plating, or the like gives a film having a high adhesiveness. By the chemical vapor phase deposition method, a film which has a less stress, a high step-coverage property, and is tight, can be formed, although the adhesiveness of the film is inferior. Thus, as a whole, the gas barrier layer 30 having a high gas barrier property (barrier property against oxygen and water) can be formed.

Referring to materials for forming the gas barrier layer 30, silicon compounds having a high chemical stability such as silicon nitrides and silicon nitride oxides are preferable. The gas barrier layer 30 may be formed into a single layer using the same material, or may be formed into plural laminated layers using different materials. In the case of the single layer, the composition may be changed continuously or discontinuously in the thickness direction.

Figure 22F:
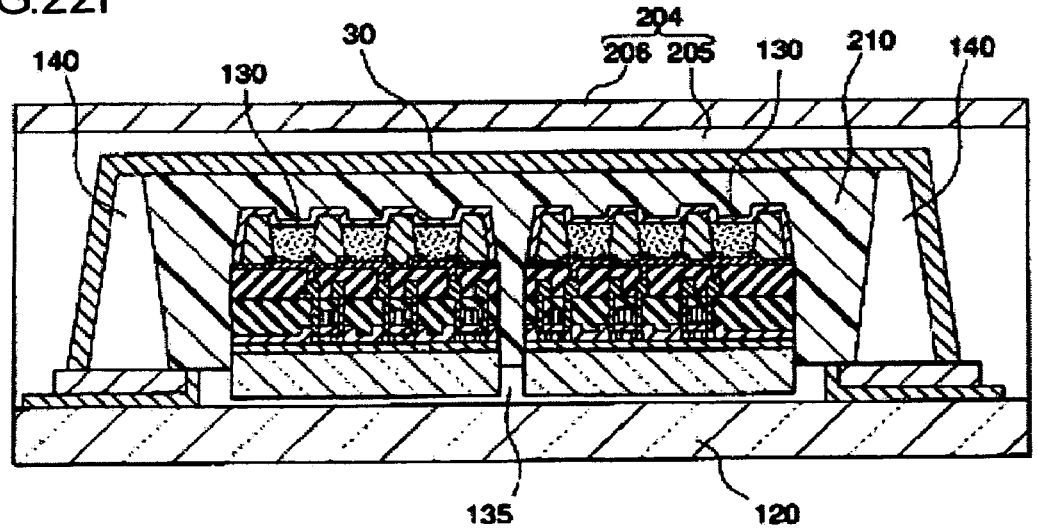

As shown in FIG. 22(f), the protection layer 204 comprising the adhesion layer 205 and the surface protection layer 206 are formed on the gas barrier layer 30. The adhesion layer 205 is formed by uniformly coating on the gas barrier layer 30 by a slit coating method or the like. Then, the surface protection layer 206 is bonded thereon.

The protection layer 204, provided on the gas barrier layer 30, has pressure-durability, an abrasion resistance, a light reflection prevention property, a gas barrier property, a UV shielding property, and so forth, and thus, the light emitting layers 60, the cathode 50, and the gas barrier layer can be protected by the surface protection layer 206. Thus, the service life of the light emitting element can be increased.

Moreover, the adhesion layer 205 has a function of buffering mechanical impacts. If an external mechanical impact is applied, the adhesion layer relaxes the mechanical impact which is given to the gas barrier layer 30 and the light emitting elements on the inner side. Thus, the function of the light emitting elements can be prevented from being degraded, which will occur due to the mechanical impact.

Thus, the EL display device 8 is produced.

Moreover, in the above embodiment, the top emission type EL display device 8 is described as an example. The present invention is not restricted to the top emission type EL display device 8, and can be applied to a bottom emission type display device and also a display device of such a type that emitted light is caused to exit from both of the sides.

Figure 23:
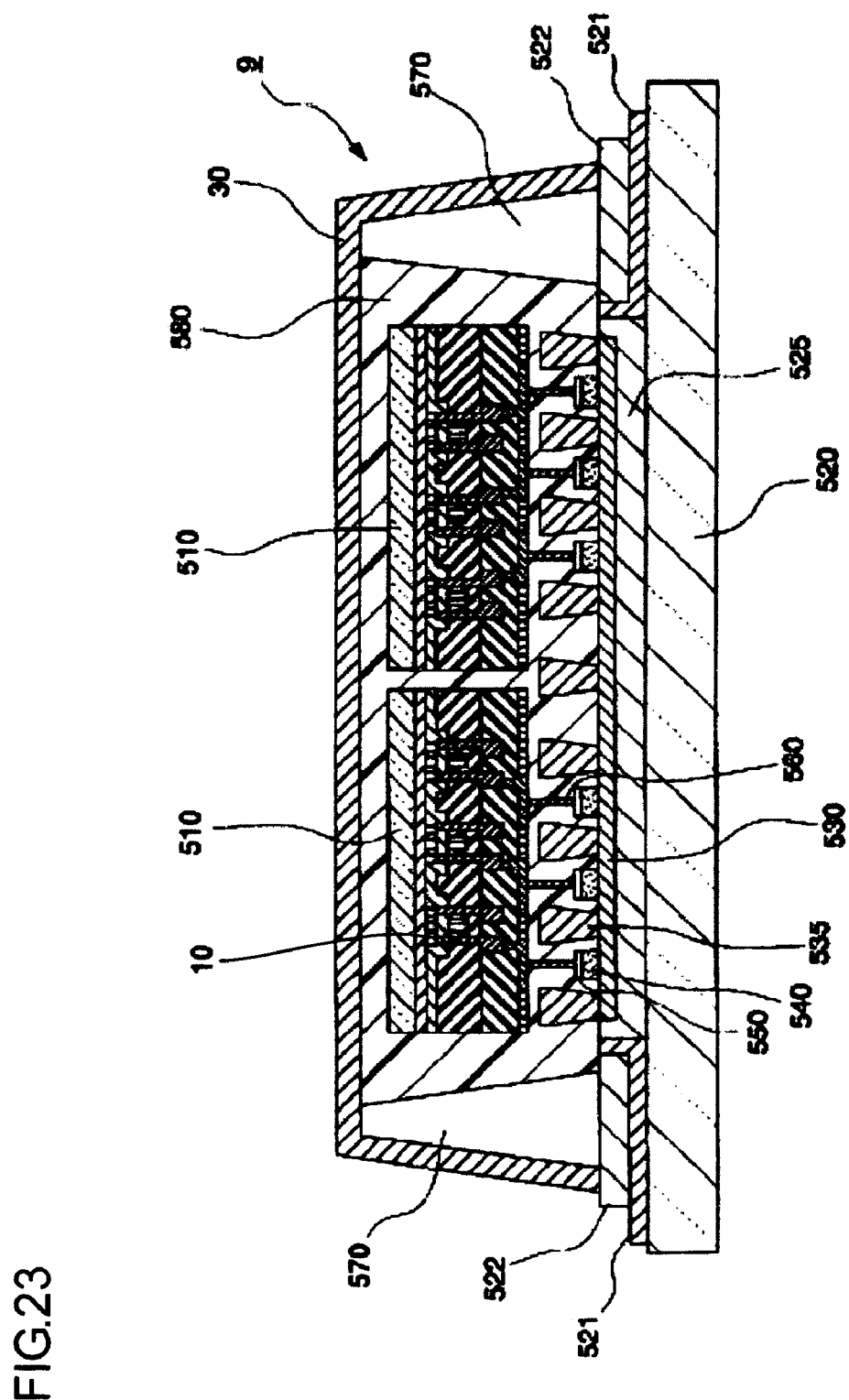
FIG. 23 is a cross-sectional view of an EL display device 9.

FIG. 23 shows an example of a bottom emission type EL display device 9.

The EL display device 8 comprises a first plate 520 and plural second plates 510. A plurality of light emitting elements (organic EL elements) each containing a anode 530, a light emitting layer 540, and a cathode 550. Semiconductor elements for driving the light emitting elements on the first plate 520 are formed on the second plates 510.

A wiring (electro-conductive layer) 521 and an insulation layer 522 are formed in the outer periphery of the first plate 520. In the center of the first plate 520, organic bank layers 535 having a reverse tapered shape, which also functions as a cathode separator are formed on the insulation layer 522 and the anode 530. The light emitting layers 540 are formed between the organic bank layers 535. The plural second plates 519 are regularly arranged on the light emitting layers 540 via conductive paste 560.

A frame 570 is formed so as to surround the plural second plate 510 and have a height larger than that of the second plates 510. A buffer layer 580 is formed on the inner side of the frame 570 so as to cover the plural second plates 510. Moreover, the gas barrier layer 30, the adhesion layer 205, and the surface protection layer 206 are formed so as to cover these members.

Moreover, the second plates 510 and the wiring 521 of the first plate 520 are connected to each other via a bonding wire or the like.

In the EL display device 9, to the upper side of the light emitting layers 540 formed on the first plate 520, the second plates 510 having semiconductor elements 10 for driving the light emitting layers 540 formed thereon are connected via the conductive paste 560. Thus, the heights of the second plates 510 tend to be irregular. Moreover, spaces are formed between the second plates 510 and the light emitting layers 540. Accordingly, it is required to remove water or the like from the spaces in order to prevent the peeling which will occur due to distortion and stress, i.e., to assure the panel strength.

For this reason, the frame 570 higher than the second plates 510 is formed in the EL display device 9. A buffer layer 580 is formed by coating inside of the bulk heat 570. Desirably, the viscosity of the buffer layer material is reduced so that the buffer layer material can enter the spaces between the second plates 510 and the light emitting layers 540.

Preferably, before the curing of the buffer layer 580, the buffer layer material is degassed to prevent air-bubbles from being incorporated into the buffer layer 580 coated inside of the bulk heat 570.

As described above, in the EL display devices 8 and 9, the plural second plates 130 and 510 are arranged on the first plates 120 and 520. The heights become irregular, and gaps are formed between the second plates 130 and 510. However, the frames 140 and 570 are formed so as to have a height larger than the second plates 130 and 510. The buffer layers 210 and 580 are formed inside of the frames 140 and 570 so as to form a substantially flat upper surface. Thereby, the steps and gaps, formed by the arrangement of the plural second plates 130 and 510, can be embedded. Thus, no stress-concentration occur in the gas barrier layer 30 formed on the buffer layers 210 and 580. Thus, the gas barrier layer 30 can be prevented from cracking and so forth.

As described above, the light emitting layers 60 are formed on the first plate or the second plates. Moreover, the present invention can be applied to a top emission type display device and a bottom emission type display device.

In the above-described embodiments, as the electro-optical device, the EL display devices 8 and 8 are applied. The present invention is not restricted to the EL display devices. The present invention can be applied to any type of electro-optical devices.

As semiconductor elements, IC and LSI may be used in addition to TFT. For the formation of an electro-optical device, plural second plates having semiconductor elements such as IC, LSI, or the like may be arranged on the first plate. The temperature- or time-dependent electrical characteristics of IC and LSI are more stable compared to those of TFT. Accordingly, an electro-optical device having stable electrical characteristics can be produced.

Moreover, a switching device of the variation of the electrical characteristics is reduced can be produced. Thus, an electro-optical device in which the dispersion of electric current flowing through the electro-optical elements is small, and more uniform display can be realized can be provided. According to the present invention, the second plates having IC and KSI formed thereon can be planarized, and moreover, concavities and convexities formed by the electrical connection of the IC and LSI to the first plate can be planarized. The gas barrier layer is formed thereon, and thereby, an electro-optical device having a high sealing property can be produced.

Hereinafter, an electronic apparatus according to the present invention will be described. The electronic apparatus contains the above-described EL display device (electro-optical device) 1 as a display unit. Specifically, the electronic apparatuses shown in FIG. 24 are exemplified.

Figure 24A:
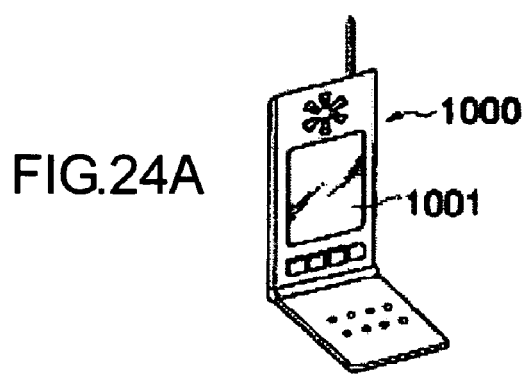
FIG. 24 shows an electronic apparatus.

FIG. 24(a) is a perspective view of an example of a portable telephone. In FIG. 24(a), a portable telephone (electronic apparatus) 1000 is provided with a display unit 1001 for which one of the above-described EL display devices 1 to 5 is used.

Figure 24B:
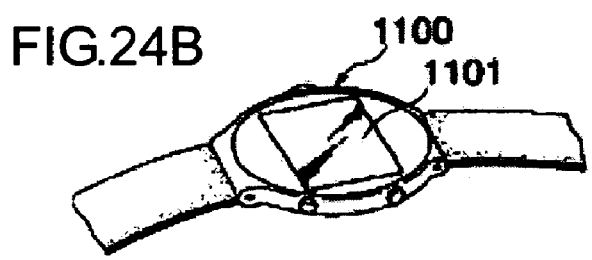

FIG. 24(b) is a perspective view of an example of a watch type electronic apparatus. In FIG. 24(b), a watch (electronic apparatus) 1100 is provided with a display unit 1101 for which one of the above-described EL display devices 1 to 5 is used.

Figure 24C:
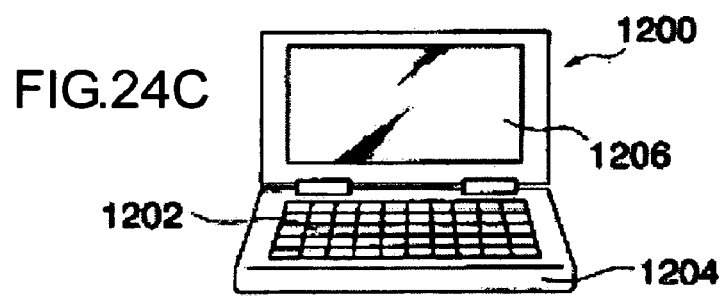

FIG. 24(c) is a perspective view of a portable information processing apparatus such as a word processor, a personal computer, or the like. In FIG. 24(c), the information processing apparatus 1200 is provided with an input unit 1202 such as a key board or the like, a display unit 1206 using one of the above-described EL display devices 1 to 5, and an information processing device main piece (casing) 1204.

Figure 24D:
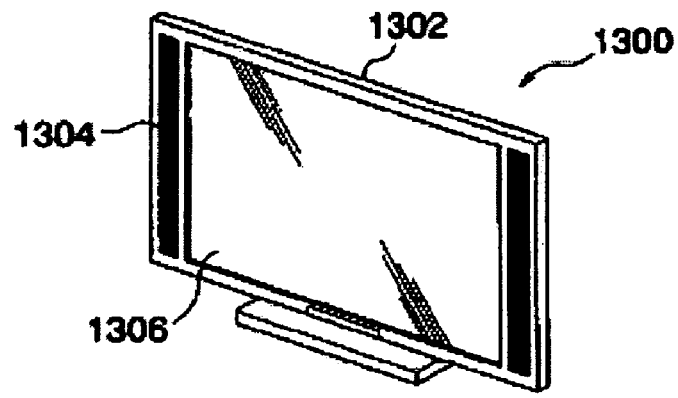

FIG. 24(d) is a perspective view of an example of a thin, large screen television (electronic apparatus). In FIG. 24(d), the thin, large screen television (electronic apparatus) 1300 is provided with a thin large screen television main portion (casing) 1302, an acoustic output portion 1304, and a display unit 1306 using one of the above-described EL display devices 1 to 5.

The respective electronic apparatuses shown in FIG. 24(a) to (c) are provided with the display units 1001, 1101, and 1206 containing the above-described EL display devices (electro-optical devices) 1. Accordingly, the service life of the light emitting element of the EL display device constituting the display unit is increased.

Regarding the electronic apparatus shown in FIG. 24(d), the EL display device can be sealed irrespective of the area of the display portion 1306 according to the present invention. Thus, the electronic apparatus is provided with the display portion (electro-optical device) 1306 having a larger area (e.g., diagonal length of 20 inch or more) not less than a compared to a know one.

What is claimed is:

1. An electro-optical device being disposed on a substrate, the electro-optical device comprising:
   a plurality of first electrodes;
   a bank structure having a plurality of openings positioned correspondingly to the formed first electrodes;
   electro-optical layers arranged in the respective openings;
   a second electrode covering the bank structure and the electro-optical layers;
   a buffer layer formed so as to cover the second electrode and have a substantially flat upper surface;
   a frame made of a material having no affinity to the buffer layer and surrounding a periphery of the buffer layer; and
   a gas barrier layer covering the buffer layer and the frame, the gas barrier layer being in direct contact with the buffer layer and the frame.

2. An electro-optical device according to claim 1, the buffer layer being formed with an organic resin material.

3. An electro-optical device according to claim 2, the buffer layer being a cured coat formed by coating an organic resin material having a lipophilic property and diluted with an organic solvent, and removing the organic solvent component or the remaining water under a reduced pressure.

4. An electro-optical device according to claim 1, the buffer layer containing fine particles.

5. An electro-optical device according to claim 1, the frame being formed with an organic resin material.

6. An electro-optical device according to claim 5, the frame being formed with the same material as that for the bank structure.

7. An electro-optical device according to claim 6, the walls defining the openings of the bank structure and the surface of the frame being formed so as to have a liquid-repellent property.

8. An electro-optical device according to claim 1, the frame containing fine particles.

9. An electro-optical device according to claim 1, the frame being formed so as to have a contact angle to the substrate of not more than 70°.

10. An electro-optical device according to claim 1, the frame being a liquid-repellent film.

11. An electro-optical device according to claim 1, an electrode protection layer to prevent the corrosion of the second electrode being provided between the second electrode and the buffer layer.

12. An electro-optical device according to claim 1, the buffer layer covering the bank structure, ranging over the bank structure, so that the bank structure is not exposed.

13. An electro-optical device according to claim 12,
the frame being formed in the outer periphery of the bank structure.

14. An electro-optical device according to claim 13,
the gas baffler layer covering the buffer layer and the frame, ranging over the buffer layer and the frame, so that the buffer layer and the frame are not exposed.

15. An electro-optical device according to claim 14,
the gas baffler layer and/or the electrode protection layer being formed so as to come into contact with an insulation layer provided in the periphery of the substrate.

16. An electro-optical device according to claim 15,
the electrode protection layer and the gas baffler layer being formed so as to come into contact with each other in the outer periphery of the substrate.

17. An electro-optical device according to claim 1,
the gas baffler layer being covered with a protection layer so as not to be exposed.

18. An electronic apparatus including the electro-optical device specified in claim 1.

19. An electro-optical device being disposed on a substrate, the electro-optical device comprising:
a plurality of first electrodes;
a bank structure having a plurality of openings positioned correspondingly to the formed first electrodes;
electro-optical layers arranged in the respective openings;
a second electrode covering the bank structure and the electro-optical layers;
the device including a buffer layer formed so as to cover the second electrode and have a substantially flat upper surface;
a frame made of a material having no affinity to the buffer layer and surrounding a periphery of the buffer layer; and
a gas barrier layer covering the buffer layer and the frame,
the frame being formed with an organic resin material having a hydrophilic property.

20. An electro-optical device being disposed on a substrate, the electro-optical device comprising:
a plurality of first electrodes;
a bank structure having a plurality of openings positioned correspondingly to the formed first electrodes;
electro-optical layers arranged in the respective openings;
a second electrode covering the bank structure and the electro-optical layers;
the device including a buffer layer formed so as to cover the second electrode and have a substantially flat upper surface;
a frame made of a material having no affinity to the buffer layer and surrounding a periphery of the buffer layer; and
a gas barrier layer covering the buffer layer and the frame,
the frame being a liquid-repellent film, and
the liquid-repellent film being made of a monomolecular film containing fluorine atoms.

21. An electro-optical device in which plural second plates having semiconductor elements formed thereon is arranged on a first plate, and electro-optical elements formed on one of the first plate and one of the plural second plates are driven by use of the semiconductor elements, the electro-optical device comprising:
a frame formed so as to surround a periphery of the plural second plates in an outer periphery of the first plate and have a height larger than that of the second plates;
a buffer layer arranged inside of the frame and covering the plural second plates; and
a gas baffler layer covering the buffer layer and the frame.

22. An electro-optical device according to claim 21,
the buffer layer being formed so as to have a smooth, continuous upper surface.

23. An electro-optical device according to claim 21,
electro-optical elements being formed on the first plate.

24. An electro-optical device according to claim 21,
electro-optical elements being formed on the second plates.

25. An electro-optical device according to claim 21,
light from the electro-optical elements being transmitted through the first plate and being caused to exit to the outside.

26. An electro-optical device according to claim 21,
light from the electro-optical elements being transmitted through the buffer layer and being caused to exit to the outside.

* * * * *